United States Patent [19]

Paranthaman et al.

[11] Patent Number: 6,156,376
[45] Date of Patent: Dec. 5, 2000

[54] BUFFER LAYERS ON METAL SURFACES HAVING BIAXIAL TEXTURE AS SUPERCONDUCTOR SUBSTRATES

[75] Inventors: Mariappan Paranthaman; Dominic F. Lee; Donald M. Kroeger; Amit Goyal, all of Knoxville, Tenn.

[73] Assignee: UT-Battelle, LLC, Oak Ridge, Tenn.

[21] Appl. No.: 09/399,684

[22] Filed: Sep. 21, 1999

Related U.S. Application Data

[60] Division of application No. 09/174,188, Oct. 16, 1998, which is a continuation-in-part of application No. 09/096,559, Jun. 12, 1998.

[51] Int. Cl.[7] ........................................ B05D 7/00
[52] U.S. Cl. ........................ 427/126.3; 427/126.1; 427/419.1; 427/419.2; 427/419.3
[58] Field of Search ................ 427/126.1, 126.3, 427/419.1, 419.2, 419.3

[56] References Cited

U.S. PATENT DOCUMENTS 5,741,377   4/1998   Goyal et al. .

OTHER PUBLICATIONS

Wu et al, *Appl. Phys. Lett.*, 65 (15) Oct. 10,1994, p. 1961.

Paranthaman et al, *Physica*, C 275, 1997, pp. 266–272, (no month).

*Primary Examiner*—Archene Turner
*Attorney, Agent, or Firm*—Quarles & Brady LLP

[57] ABSTRACT

Buffer layer architectures are epitaxially deposited on biaxially-textured rolled substrates of nickel and/or copper and their alloys for high current conductors, and more particularly buffer layer architectures such as $Y_2O_3/Ni$, $YSZ/Y_2O_3/Ni$, $RE_2O_3/Ni$, (RE=Rare Earth), $RE_2O_3/Y_2O_3/Ni$, $RE_2O_3/CeO_2/Ni$, and $RE_2O_3/YSZ/CeO_2/Ni$, $Y_2O_3/Cu$, $YSZ/Y_2O_3/Cu$, $RE_2O_3/Cu$, $RE_2O_3/Y_2O_3/Cu$, $RE_2O_3/CeO_2/Cu$, and $RE_2O_3/YSZ/CeO_2/Cu$. Deposition methods include physical vapor deposition techniques which include electron-beam evaporation, rf magnetron sputtering, pulsed laser deposition, thermal evaporation, and solution precursor approaches, which include chemical vapor deposition, combustion CVD, metal-organic decomposition, sol-gel processing, and plasma spray.

5 Claims, 24 Drawing Sheets

Buffer layer architectures on textured substrates for high-current conductors

BUFFER LAYERS ON METAL SURFACES HAVING BIAXIAL TEXTURE AS SUPERCONDUCTOR SUBSTRATES

CROSS-REFERENCE TO RELATED APPLICATIONS

This is a Divisional of application Ser. No. 09/174,188 filed Oct. 16, 1998, which is a Continuation-In-Part of application Ser. No. 09/096,559 filed Jun. 12, 1998.

The present invention relates to issued U.S. Pat. No. 5,741,377 "Structures Having Enhanced Biaxial Texture and Method of Fabricating Same" by Goyal et al., filed Apr. 10, 1995 and issued Apr. 21, 1998; to pending U.S. patent application Ser. No. 08/670,871 "High Tc YBCO Superconductor Deposited on Biaxially Textured Ni Substrate" by Budai et al., filed Jun. 26, 1996; and also to U.S. Patent Application "MgO Buffer Layers on Rolled Nickel Superconductor Substrates," by Paranthaman et al., filed on Jun. 12, 1998, all of which are hereby incorporated in their entirety by reference.

The United States Government has rights in this invention pursuant to contract no. DE-AC05-96OR22464 between the United States Department of Energy and Lockheed Martin Energy Research Corporation.

FIELD OF THE INVENTION

The present invention relates to structures upon which high current conductors may be epitaxially deposited on biaxially-textured rolled substrates of nickel and/or copper and other metals and alloys which can be characterized by a surface having biaxial texture. Also described are methods for fabricating said structures. The structures and methods for making the structures include but are not limited to $Y_2O_3$/SS (SS=Substrate comprising at least one metal and having a surface exhibiting biaxial texture), YSZ/$Y_2O_3$/SS (YSZ=yttria-stabilized zirconia), $RE_2O_3$/SS (RE=Rare Earth), $RE_2O_3$/$Y_2O_3$/SS, $Y_2O_3$/$CeO_2$/SS, $RE_2O_3$/$Ce_2O_3$/SS, $Y_2O_3$/YSZ/$CeO_2$/SS, $RE_2O_3$/YSZ/$CeO_2$/SS, and $(RE')_xO_y$/SS (RE'=any combination which includes, but is not limited to Rare Earth elements, wherein x is a value near 2.0, believed to be between about 1.95 and about 2.05, (hereinafter stated as about 2.0), and wherein y is between about 3.0 and about 3.7).

BACKGROUND OF THE INVENTION

It has long been desired to grow biaxially oriented oxide buffer layers other than $CeO_2$ directly on textured substrates, and also to have a single buffer layer on textured substrates. Also it has been desired to provide an alternative to pulsed laser deposition processes that may be easier to scale up for producing long length substrates.

Recent developments in deposited conductors, both rolling assisted biaxially textured substrates (RABiTS), and ion-beam assisted deposition (IBAD) based on $YBa_2Cu_3O_7$ superconductors are promising, and are herein reported for the first time.

The "deposited conductor" approach described herein is useful for growing superconductors such as $REBa_2Cu_3O_7$, $(Bi,Pb)_2Sr_2Ca_{n-1}CunO_{2n+4}$ (n=1–3), $Tl_1Ba_2Ca_{n-1}Cu_nO_{2n+3}$ (n=1–4), $Tl_2Ba_2Ca_{n-1}Cu_nO_{2n+4}$ (n=1–3), and $Hg_1Ba_2Ca_{n-1}Cu_nO_{2n+2+\delta}$ (n=1–4) with high critical-current densities. These high $J_c$ conductors will be suitable for transmission lines and various other applications. The demonstrated buffer layers may also be useful for photovoltaics, ferroelectrics, sensors, and electro-optic applications.

The following sections of publications also relate to the present invention, and are hereby incorporated by reference:

X. D. Wu, S. R. Foltyn, P. Arendt, J. Townsend, C. Adams, I. H. Campbell, P. Tiwari, Y. Coulter, and D. E. Peterson, Appl. Phys. Lett. 65 (15), Oct. 10, 1994, p1961.

M. Paranthaman et al., Physica C 275 (1997) 266–272.

OBJECTS OF THE INVENTION

Accordingly, it is an object of the present invention to provide new and improved biaxially oriented oxide buffer layers other than $CeO_2$ directly on textured-Ni and/or Cu substrates.

It is another object to provide an alternative to pulsed laser deposition processes as well as improved buffer layer architectures that may be easier to scale up for producing long length substrates.

Further and other objects of the present invention will become apparent from the description contained herein.

SUMMARY OF THE INVENTION

In accordance with one aspect of the present invention, the foregoing and other objects are achieved by a biaxially textured article which comprises a substrate comprising at least one metal, the substrate having a surface exhibiting biaxial texture; and a buffer layer selected from the group consisting of $Y_2O_3$ and $RE_2O_3$, the buffer layer being epitaxially disposed upon the biaxially-textured surface of the substrate.

In accordance with a second aspect of the present invention, the foregoing and other objects are achieved by a biaxially textured article which comprises a substrate comprising at least one metal, the substrate having a surface exhibiting biaxial texture; a first buffer layer comprising CeO2, the first buffer layer being epitaxially disposed upon the biaxially textured surface of the substrate; and a second buffer layer selected from the group consisting of $Y_2O_3$ and $RE_2O_3$, the second buffer layer being epitaxially disposed upon the biaxially textured surface of the $CeO_2$.

In accordance with a third aspect of the present invention, the foregoing and other objects are achieved by a biaxially textured article which comprises a substrate comprising at least one metal, the substrate having a surface exhibiting biaxial texture; a first buffer layer comprising $CeO_2$, the first buffer layer being epitaxially disposed upon the biaxially textured surface of the substrate; a second buffer layer comprising YSZ, the second buffer layer being epitaxially disposed upon the biaxially textured surface of the $CeO_2$; and a third buffer layer selected from the group consisting of $Y_2O_3$ and $RE_2O_3$, the third buffer layer being epitaxially disposed upon the biaxially textured surface of the YSZ.

In accordance with a fourth aspect of the present invention, the foregoing and other objects are achieved by a biaxially textured article which comprises a substrate comprising at least one metal, the substrate having a surface exhibiting biaxial texture; and a buffer layer comprising $(RE')_xO_y$, wherein x is about 2.0, and y is between about 3.0 and about 3.7, the buffer layer being epitaxially disposed upon the biaxially textured surface of the substrate.

In accordance with a fifth aspect of the present invention, the foregoing and other objects are achieved by a method for making a biaxially textured article which comprises the steps of: providing a substrate comprising at least one metal, the substrate having a surface exhibiting biaxial texture; and epitaxially depositing upon the biaxially textured surface of the substrate a buffer layer selected from the group consisting of $Y_2O_3$ and $RE_2O_3$.

In accordance with a sixth aspect of the present invention, the foregoing and other objects are achieved by a method for making a biaxially textured article which comprises the steps of: providing a substrate comprising at least one metal, the substrate having a surface exhibiting biaxial texture; epitaxially depositing upon the biaxially textured surface of the substrate a first buffer layer comprising $CeO_2$; and epitaxially depositing upon the biaxially textured surface of the $CeO_2$ a second buffer layer selected from the group consisting of $Y_2O_3$ and $RE_2O_3$.

In accordance with a seventh aspect of the present invention, the foregoing and other objects are achieved by a method for making a biaxially textured article which comprises the steps of: providing a substrate comprising at least one metal, the substrate having a surface exhibiting biaxial texture; epitaxially depositing upon the biaxially textured surface of the substrate a first buffer layer comprising $CeO_2$; epitaxially depositing upon the biaxially textured surface of the $CeO_2$ a second buffer layer comprising YSZ, and epitaxially depositing upon the biaxially textured surface of the YSZ a third buffer layer selected from the group consisting of $Y_2O_3$ and $RE_2O_3$.

In accordance with an eighth aspect of the present invention, the foregoing and other objects are achieved by a method for making a biaxially textured article which comprises the steps of: providing a substrate comprising at least one metal, the substrate having a surface exhibiting biaxial texture; and epitaxially depositing upon the biaxially textured surface of the substrate a buffer layer comprising $(RE')_xO_y$, wherein x is about 2.0, and y is between about 3.0 and about 3.7.

For a better understanding of the present invention, together with other and further objects, advantages and capabilities thereof, reference is made to the following disclosure and appended claims in connection with the above-described drawings.

DETAILED DESCRIPTION OF THE INVENTION

This invention describes how to grow biaxially oriented oxide buffer layers other than $CeO_2$ directly on textured-Ni and/or Cu substrates and other metals and alloys which can be characterized by a surface having biaxial texture, and also describes methods for making buffer layers on textured substrates. High rate depositions are accomplished by the demonstrated reactive evaporation. Some of the buffer layers grown may be excellent diffusion barriers for Ni and/or Cu and may be chemically compatible with the high temperature superconductors. This invention also demonstrates the possibility of having a single buffer layer on textured-Ni and/or Cu substrates. This invention also demonstrates the possibility of obtaining predominantly the single texture component of YBCO superconductors. This invention opens up a wide variety of possibilities of growing several other buffer layers such as $REAlO_3$(RE=Rare Earth), $AEZrO_3$, (AE=Alkaline Earth, Ca,Sr,Ba), $RE_2Zr_2O_7$, Ca-stabilized Zirconia, Ti, Nb or Zr doped $CeO_2$, and $AECeO_3$ on either buffered-rolled metal substrates or directly on rolled metal substrates. These buffer layers may be of interest to other areas like photovoltaics, ferroelectrics, sensors and optoelectronic devices.

Figure 1:
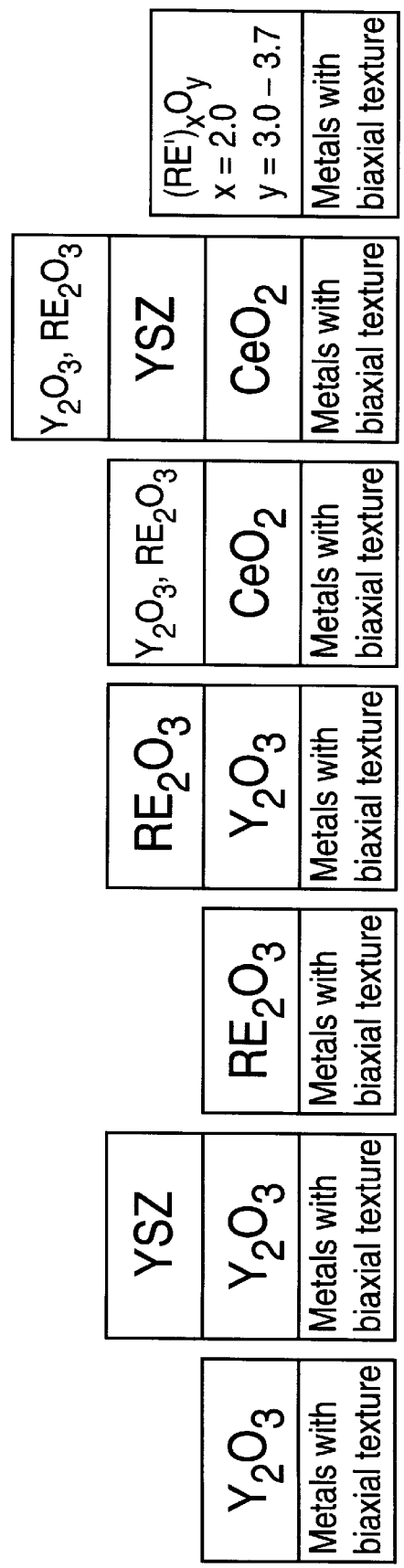
FIG. 1 is a schematic diagram of the various buffer layer architectures developed on textured-Ni and/or textured-Cu substrates.

Buffer layers such as $Y_2O_3$, $RE_2O_3$, $CeO_2$, and YSZ were deposited on RABiTS by vacuum processing techniques such as electron-beam evaporation and rf magnetron sputtering. FIG. 1 summarizes the architectures of various buffer layers developed in this invention.

The first buffer layer comprises an epitaxial laminate of $Y_2O_3$, $RE_2O_3$, $RE_2O_3$/$Y_2O_3$or YSZ/$Y_2O_3$ deposited on a biaxially cube textured Ni and/or Cu substrate. The crystallographic orientation of the $Y_2O_3$, $RE_2O_3$, and YSZ were mostly (100). The second alternative buffer layer comprises an epitaxial laminate of $Y_2O_3$ or $RE_2O_3$ on $CeO_2$-buffered Ni and/or Cu substrates. The third alternative buffer layer comprises an epitaxial laminate of $RE_2O_3$(RE=Rare Earth)/ YSZ/$CeO_2$/Ni (or Cu). The $RE_2O_3$ films were grown epitaxially on YSZ-buffered Ni or Cu substrates. YBCO ($YBa_2Cu_3O_{7-x}$) has also been grown on some of the buffer layers by pulsed laser deposition. An estimated $J_c$ of $0.7 \times 10^6$ A/cm$^2$ at 77° K and zero field for a film with the architecture YBCO/$Yb_2O_3$/$CeO_2$/Ni. A $J_c$ of $1.4 \times 10^6$ A/cm$^2$ at 77° K and zero field was also obtained for YBCO/$Yb_2O_3$/YSZ/$CeO_2$/Ni, and a $J_c$ of $0.8 \times 10^6$ A/cm$^2$ at 77° K for YBCO/$Yb_2O_3$/$Y_2O_3$/Ni. The above-described buffer layers may also be useful for the subsequent growth of superconductors such as $REBa_2Cu_3O_7$(RE=Rare Earth), $(Bi,Pb)_2Sr_2Ca_{n-1}Cu_nO_{2n+4}$ (n=1–3), $Tl_1Ba_2Ca_{n-1}Cu_nO_{2n+3}$ (n=1–4), $Tl_2Ba_2Ca_{n-1}Cu_nO_{2n+4}$ (n=1–3), and $Hg_1Ba_2Ca_{n-1}Cu_nO_{2n+2+\delta}$ (n=1–4) that are chemically and epitaxially compatible with $Y_2O_3$, and $RE_2O_3$ buffer layers.

For purposes herein, the following definitions apply: Biaxial(ly) Texture: The films are oriented in both out-of-plane (along the (001) direction) and in plane (along the (100) direction) directions. Epitaxial(ly): The films grown on a particular substrate will grow in the same orientation of the substrate is defined as epitaxial, for example, cube-on-cube orientation. Thus, a buffer layer as described herein as having been epitaxially deposited upon a biaxially-textured surface also exhibits a biaxially textured surface. RABiTS: Rolling-assisted biaxially-textured substrates; Rare Earth (RE): The group of elements which consists of: La, Ce, Pr, Nd, Pm, Sm, Eu, Gd, Tb, Dy, Ho, Er, Tm, Yb, and Lu. RE': any combination including but not limited to Rare Earth elements. $(RE')_xO_y$. Any combination including but not limited to Rare Earth oxides, especially wherein x is about 2.0, and y is between about 3 and about 3.7. YBCO: $YBa_2Cu_3O_{7-x}$. YSZ: yttria-stabilized zirconia. Table 1 summarizes the list of rare earth oxides and their structure type.

The specific processing conditions of the successful multi-layer sequences are described in detail hereinbelow.

EXAMPLE 1

Growth of $Y_2O_3$ on Textured-Ni and/or Cu Substrates by E-beam Evaporation

Figure 2:
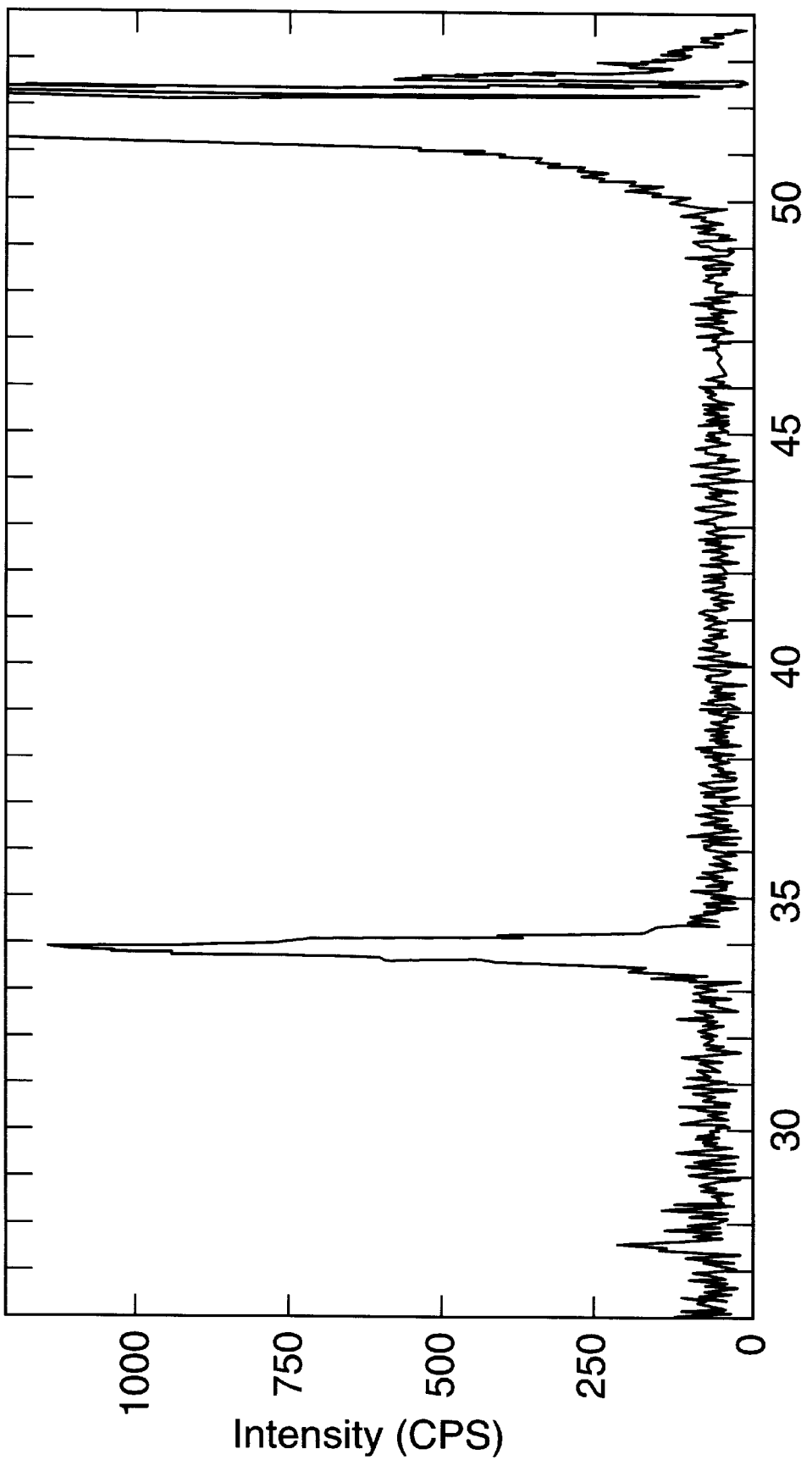
FIG. 2 is the room temperature powder X-ray diffraction pattern for a 100 nm thick $Y_2O_3$ film grown on textured-Ni substrates by e-beam evaporation.
Figure 3:
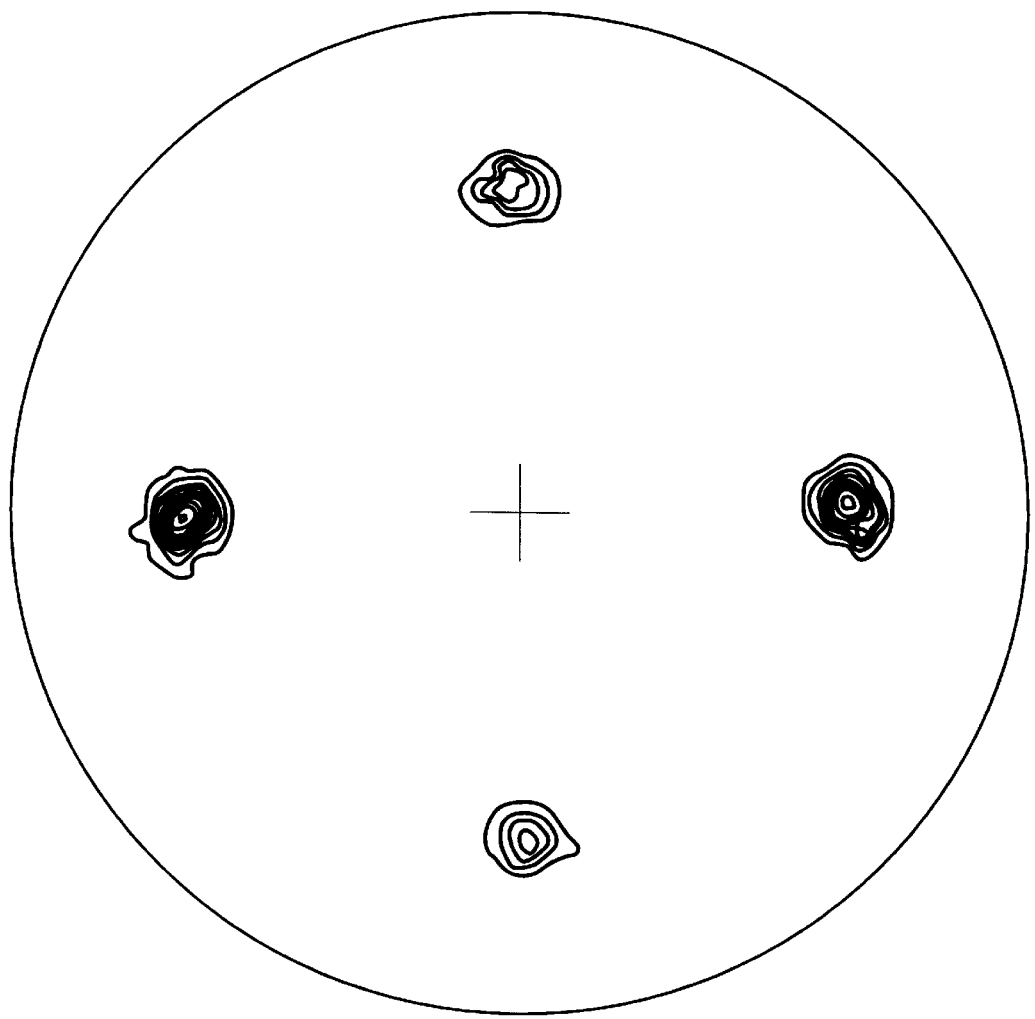
FIG. 3 is the $Y_2O_3$ (222) pole figure for $Y_2O_3$ films grown directly on textured-Ni substrates by e-beam evaporation.

An electron beam (e-beam) evaporation technique was used to deposit $Y_2O_3$ films directly on Ni. The as-rolled Ni substrates were cleaned ultrasonically with both acetone and methanol and recrystallized to the desired (100) cube texture by annealing the substrates at 800° C. for 2 hours in a vacuum of $10^{-6}$ Torr. Biaxially oriented Ni substrates were mounted on a substrate holder with a heater assembly in the e-beam system. After the vacuum in the chamber had reached $1 \times 10^{-6}$ Torr at room temperature, a gas mixture of 4% $H_2$ and 96% Ar was introduced until the pressure inside the chamber reached 1 Torr. The Ni substrates were annealed at 700° C. for 1 hour at that pressure. The chamber was then pumped and maintained at a pressure of $2 \times 10^{-5}$ Torr using a mixture of 4% $H_2$ and 96% Ar. The gas flow was controlled by a dc-powered piezoelectric valve. The $Y_2O_3$ layers were grown on the Ni substrates at temperatures ranging from 200 to 750° C. The deposition rate for $Y_2O_3$ was 1–5 Å/sec with the operating pressure of $10^{-5}$ Torr, and the final thickness was varied from 20 nm to 200 nm. The crucibles used were mostly of tungsten. Yttrium metal was used as the source. The XRD results from the θ–2θ scan (as shown in FIG. 2), ω and φ scans for as-deposited $Y_2O_3$ (20 nm thick) on Ni at 700° C. are as follows: The strong $Y_2O_3$ (200) from FIG. 2 revealed the presence of a good out-of-plane texture. The FWHM for Ni (200) and $Y_2O_3$ (200) are 7.2° and 7.1°, and that of Ni (202) and $Y_2O_3$ (222) are 11.7° and 8.4°, respectively. The $Y_2O_3$ (222) pole figure for $Y_2O_3$ films grown at 700° C. on Ni is shown in FIG. 3. From the XRD results, it can be concluded that $Y_2O_3$ can be grown epitaxially on Ni. The $CeO_2$ was also grown epitaxially on textured-Ni substrates at about 625° C. using Ce metal as the source.

The pulsed laser deposition technique was used to grow YBCO at 780° C. and 185 mTorr $O_2$ on all the buffered-Ni substrates.

The methods described in Example 1 can also be used to grow $Y_2O_3$ on textured-Cu substrates as well as on alloys of Cu and/or Ni and other metals and alloys which can be characterized by a surface having biaxial texture by e-beam evaporation.

EXAMPLE 2

Growth of $Yb_2O_3$ on Textured-Ni and/or Cu Substrates by E-beam Evaporation

Figure 4:
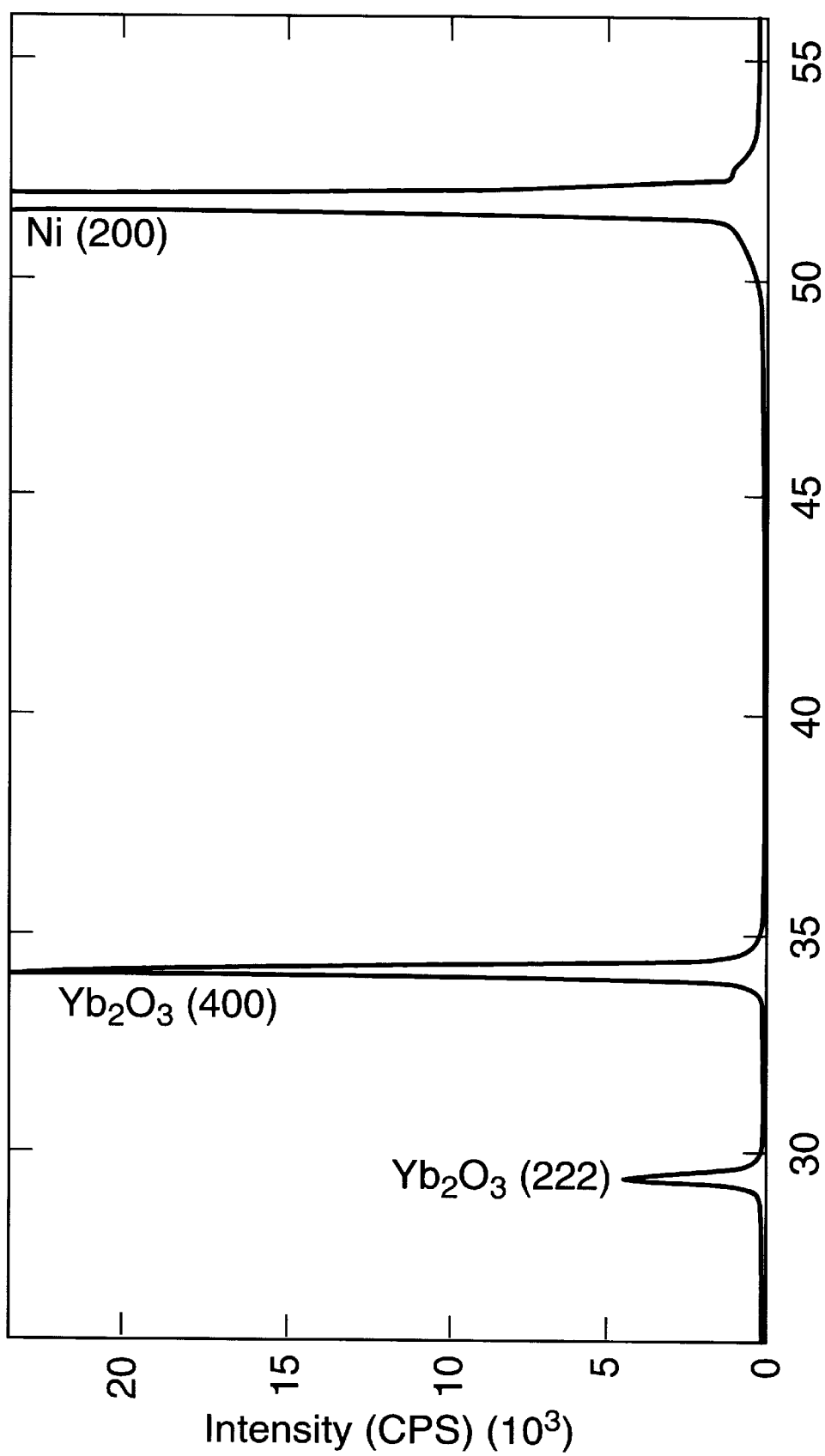
FIG. 4 is the room temperature powder X-ray diffraction pattern for a 100 nm thick $Yb_2O_3$ film grown on textured Ni substrates by e-beam evaporation.
Figure 5:
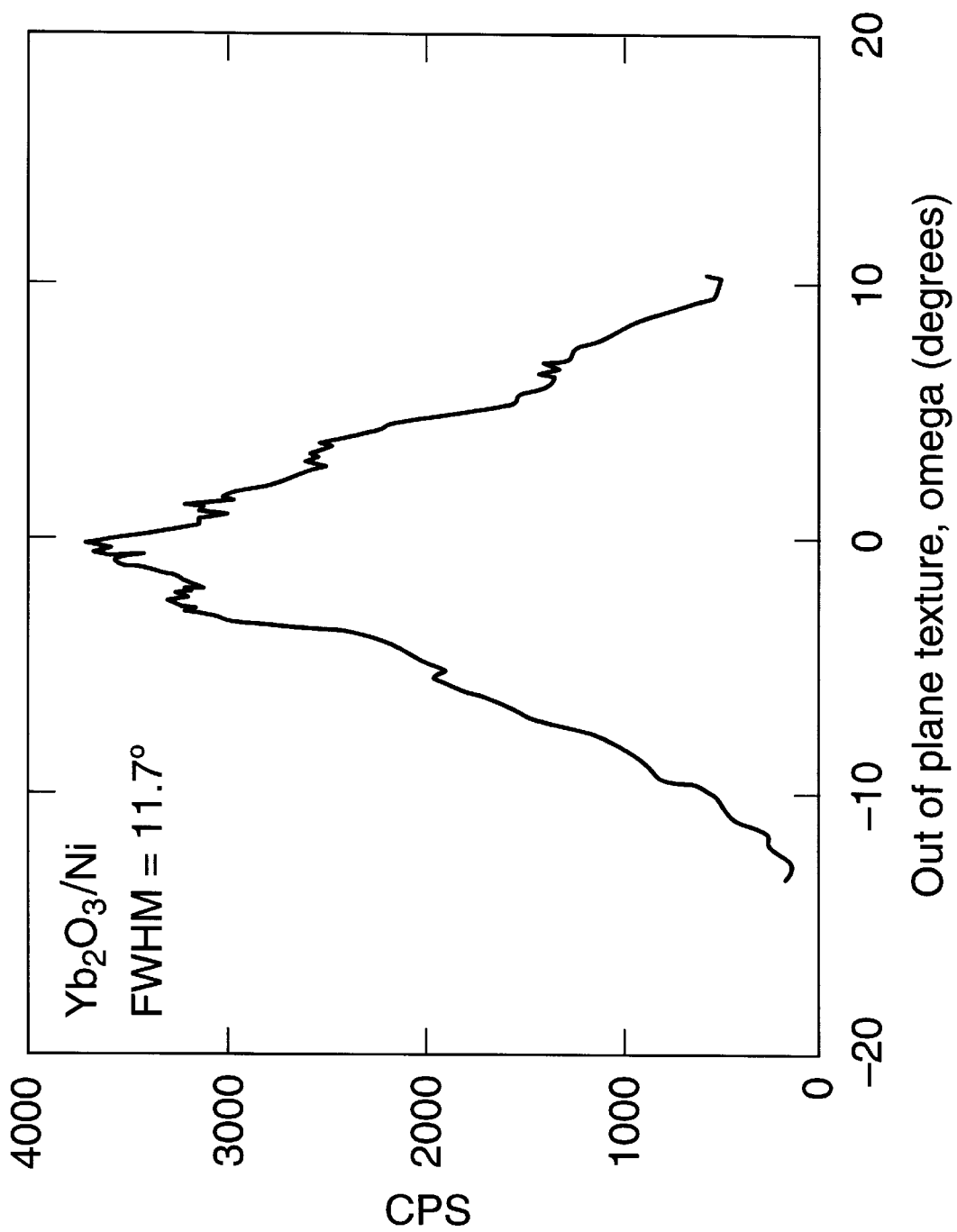
FIG. 5 is an X-ray ω scan for a 100 nm thick $Yb_2O_3$-buffered Ni substrates with FWHM of 11.7° for $Yb_2O_3$ (400).
Figure 6:
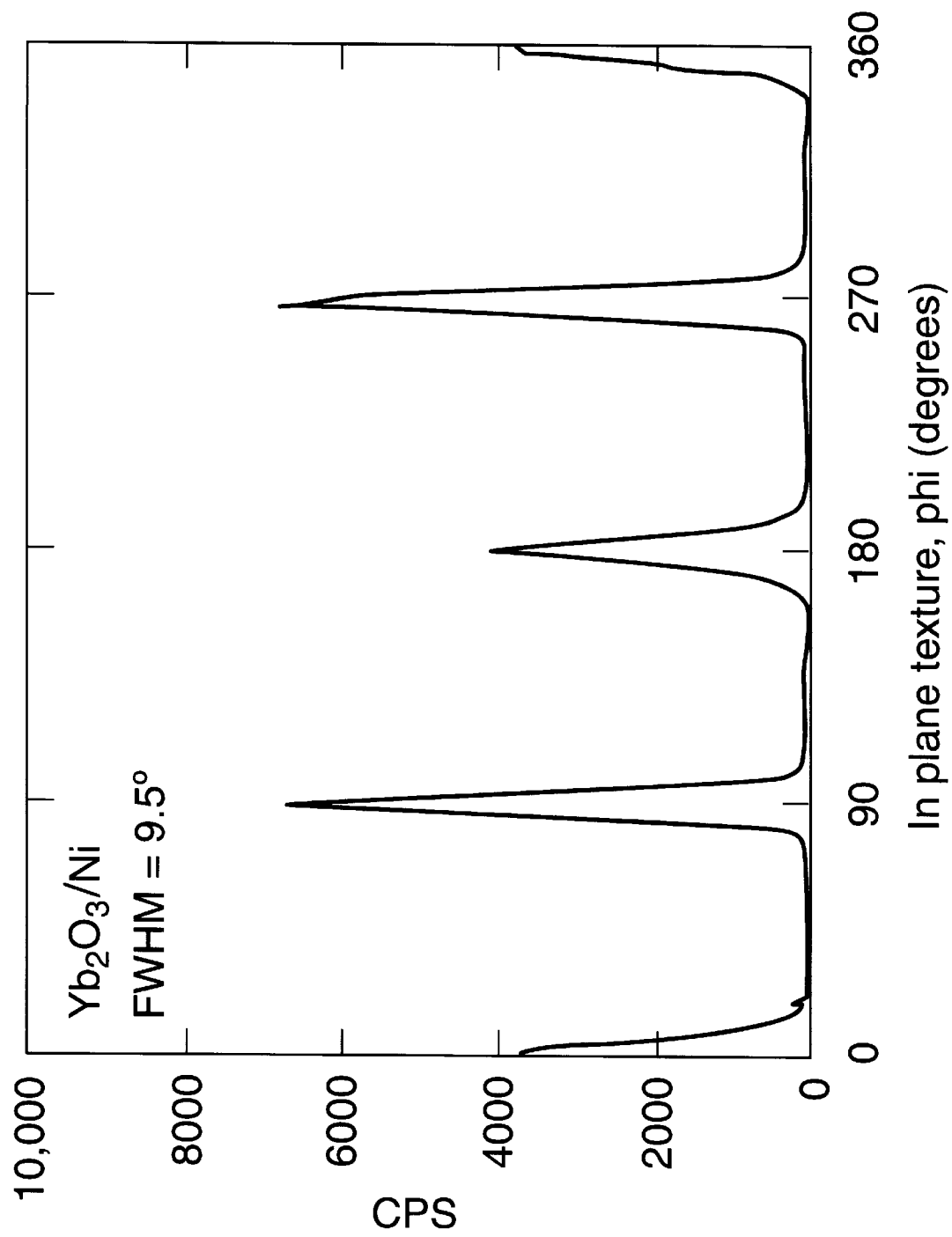
FIG. 6 is an X-ray φ scan for a 100 nm thick $Yb_2O_3$-buffered Ni substrates with FWHM of 9.5° for $Yb_2O_3$ (222).

An electron beam (e-beam) evaporation technique was used to deposit $Yb_2O_3$ films directly on Ni. The as-rolled Ni substrates were cleaned ultrasonically with both acetone and methanol and recrystallized to the desired (100) cube texture by annealing the substrates at 800° C. for 2 hours in a vacuum of $10^{-6}$ Torr. Biaxially oriented Ni substrates were mounted on a substrate holder with a heater assembly in the e-beam system. After the vacuum in the chamber had reached $1 \times 10^{-6}$ Torr at room temperature, a gas mixture of 4% $H_2$ and 96% Ar was introduced until the pressure inside the chamber reached 1 Torr. The Ni substrates were annealed at 650° C. for 1 hour at that pressure. The chamber was then pumped and maintained at a pressure of $2 \times 10^{-5}$ Torr using a mixture of 4% $H_2$ and 96% Ar. The gas flow was controlled by a dc-powered piezoelectric valve. The $Yb_2O_3$ layers were grown on the Ni substrates at temperatures ranging from 200 to 750° C. The deposition rate for $Yb_2O_3$ was 1–5 Å/sec with the operating pressure of $10^{-5}$ Torr, and the final thickness was varied from 20 nn to 200 nm. The crucibles used were of graphite. Ytterbium oxide pellets were used as the source. The XRD results from the θ–2θ scan (as shown in FIG. 4), ω and φ scans (FIGS. 5 and 6) for as-deposited $Yb_2O_3$ (100 nm thick) on Ni at 700° C. is as follows: The strong $Yb_2O_3$ (400) from FIG. 4 revealed the presence of good out-of-plane texture. The FWHM for Yb2O3 (400) are 11.7°, and that of $Yb_2O_3$ (222) is 9.5° respectively. From the XRD results, it can be concluded that $Yb_2O_3$ can be grown epitaxially on Ni.

The methods described in Example 2 can also be used to grow $Yb_2O_3$ on textured-Cu substrates as well as on alloys of Cu and/or Ni and other metals and alloys which can be characterized by a surface having biaxial texture by e-beam evaporation.

EXAMPLE 3

Growth of YSZ on $Y_2O_3$-buffered Ni and/or Cu by rf Magnetron Sputtering

Figure 7:
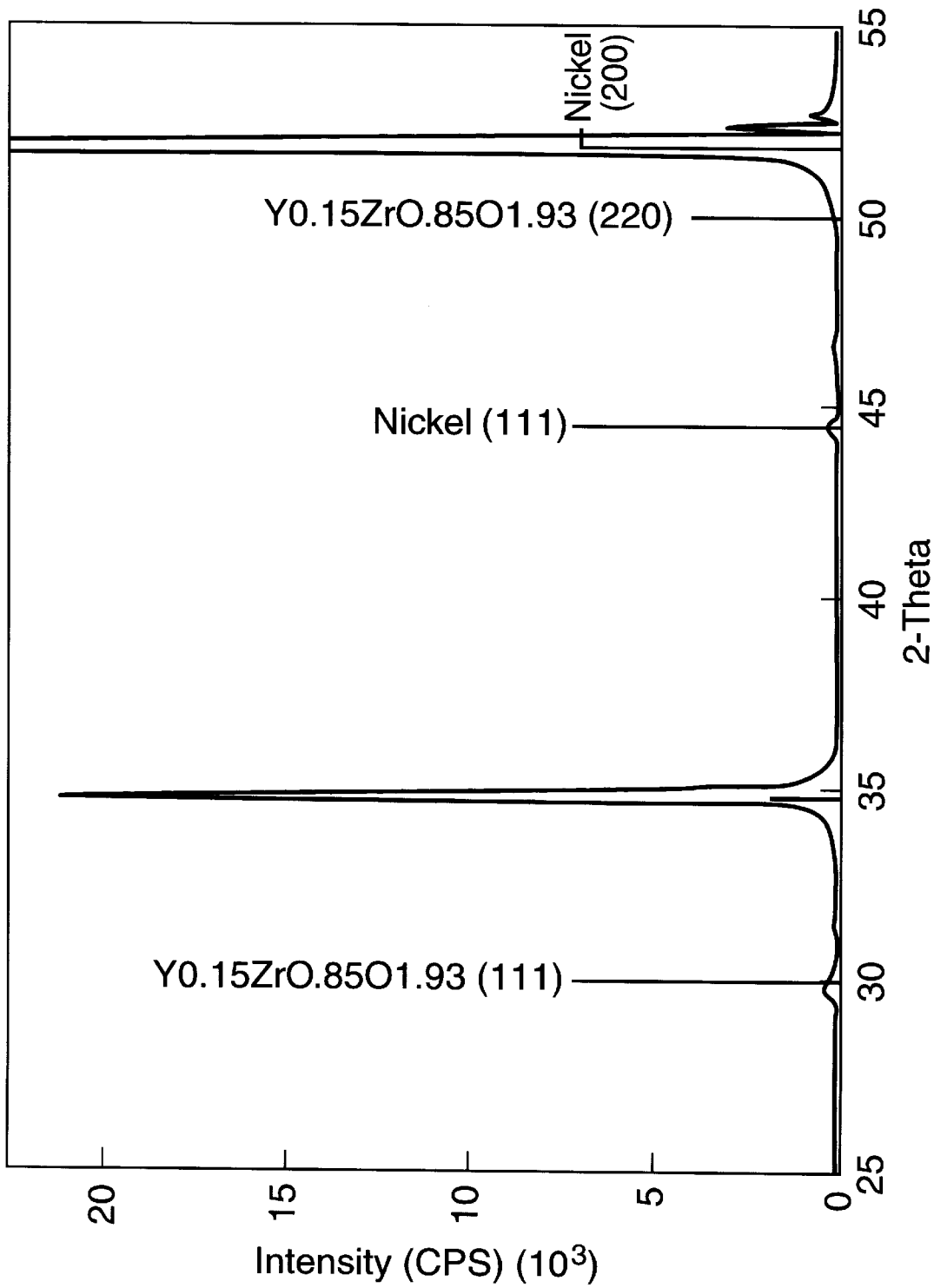
FIG. 7 is the room temperature powder X-ray diffraction pattern for a 400 nm thick YSZ film grown on $Y_2O_3$-buffered Ni substrates by rf magnetron sputtering.
Figure 8:
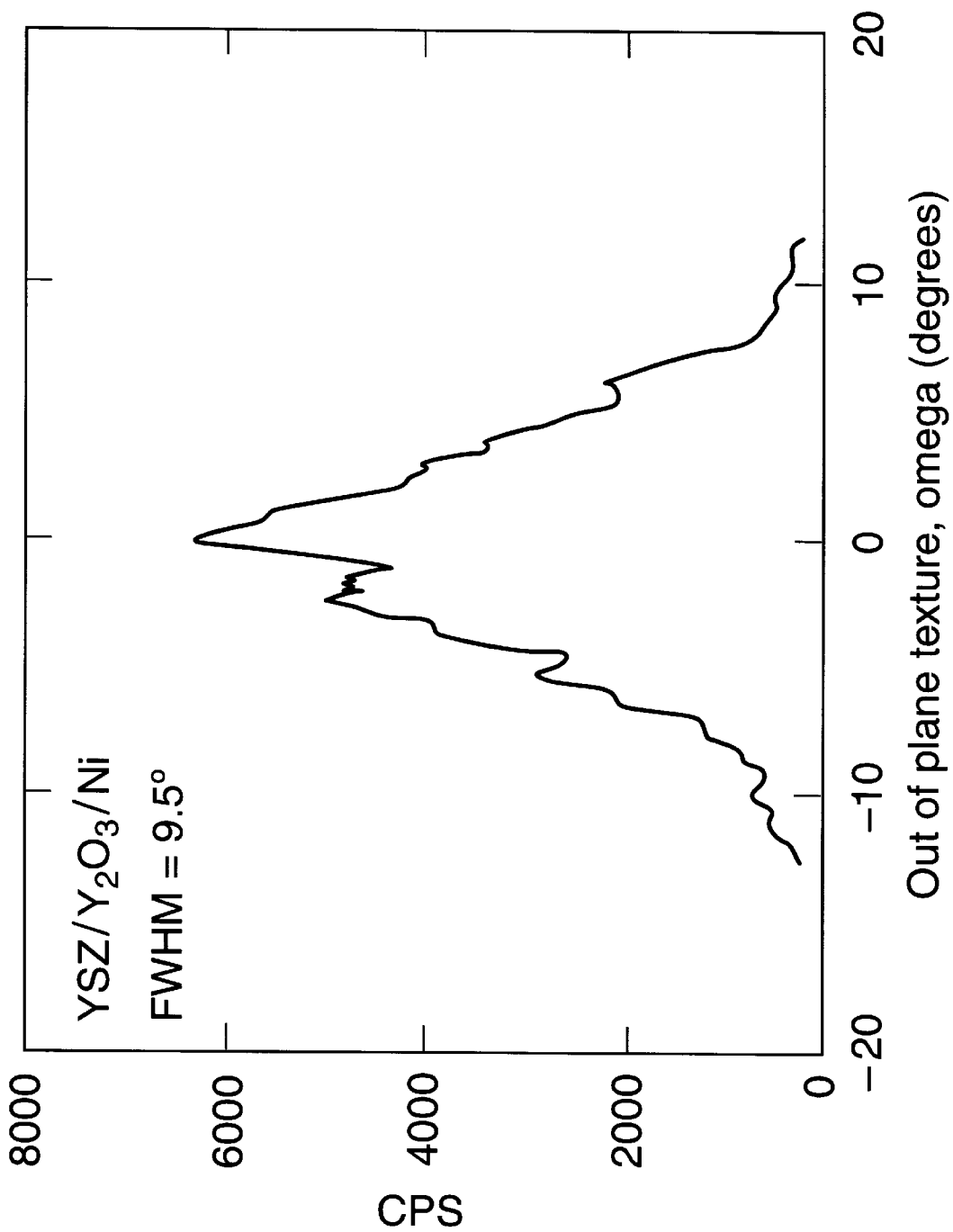
FIG. 8 is an x-ray ω scan for a 400 nm thick YSZ film grown on $Y_2O_3$-buffered Ni substrates with FWHM of 9.5° for YSZ (200).
Figure 9:
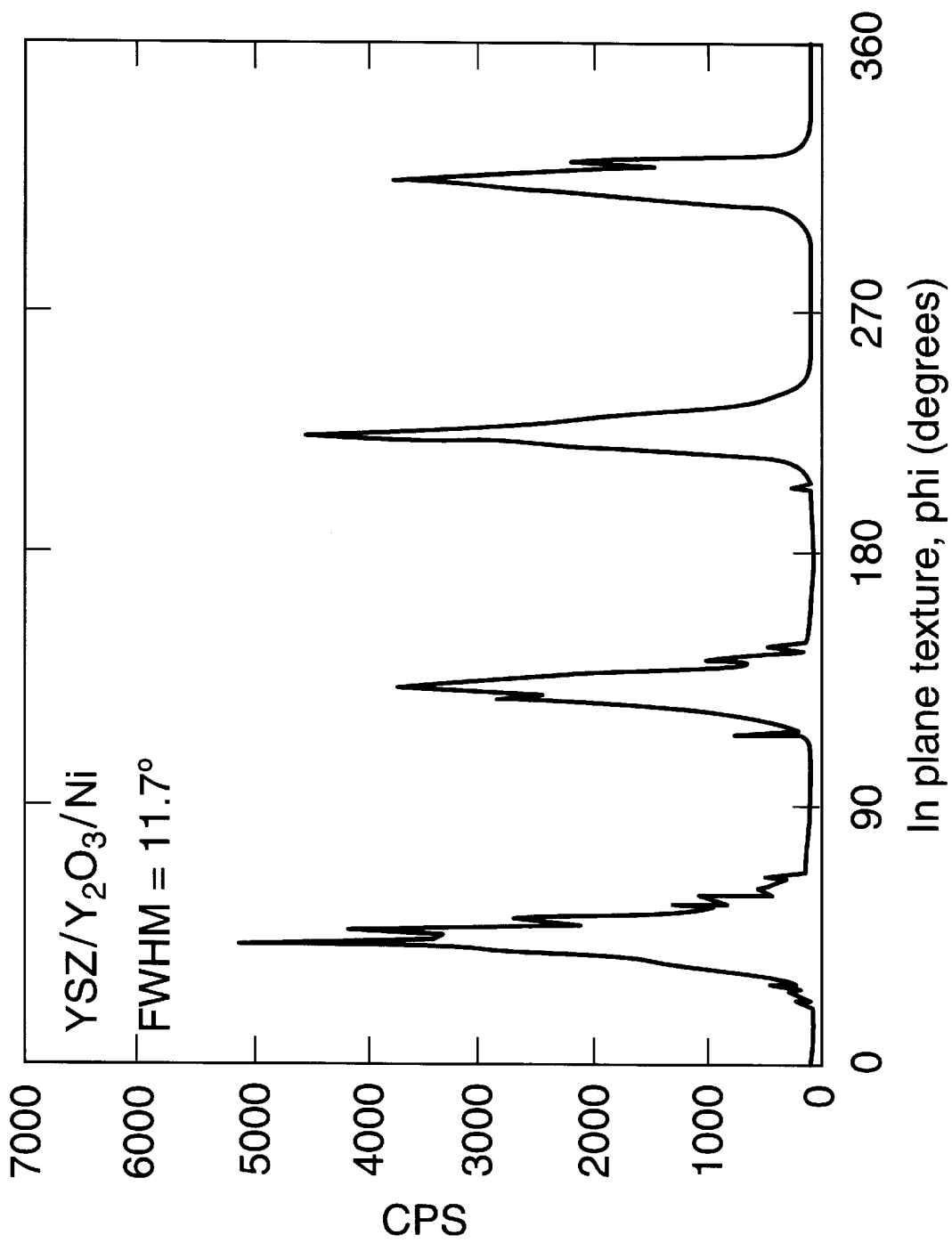
FIG. 9 is an X-ray φ scan for a 400 nm thick YSZ film grown on $Y_2O_3$-buffered Ni substrates with FWHM of 11.7° for YSZ (220).

Initially, $Y_2O_3$ films were grown epitaxially by e-beam evaporation on rolled-Ni substrated as described in Example 1. The YSZ films were grown on these $Y_2O_3$-buffered Ni substrates by rf magnetron sputtering. The $Y_2O_3$-buffered Ni substrate was mounted on a heating block inside the sputter chamber. Prior to heating the substrate, the sputter chamber was evacuated to a pressure of $1 \times 10^{-6}$ Torr. The chamber was then back-filled with a flowing mixture of 4% $H_2$ and 96% Ar to a pressure of $5 \times 10^{-2}$ Torr. The substrate was heated to 780° C. for 15 min, and then the pressure was reduced to $1 \times 10^{-2}$ Torr, and sputter deposited at about 780° C. for 80 min with an on-axis YSZ target located 6 cm from the substrate. The plasma power was 75 W at 13.56 MHz. The resulting YSZ film was smooth, and its thickness was estimated to be approximately 400 nm. The accompanying θ–2θ X-ray scan (as shown in FIG. 7) shows good out-of-plane texture for the YSZ which is consistent with epitaxy. From the ω (as shown in FIG. 8) and φ (as shown in FIG. 9) scans for a 400 nm thick YSZ film grown on $Y_2O_3$-buffered Ni substrates, the FWHM for YSZ (200), and YSZ (220) are 9.5° and 11.7°, respectively.

The methods described in Example 3 can also be used to grow YSZ on $RE_2O_3$-buffered Ni and $Y_2O_3$-buffered Cu as well as on alloys of Cu and/or Ni and other metals and alloys which can be characterized by a surface having biaxial texture by rf magnetron sputtering.

EXAMPLE 4

Figure 10:
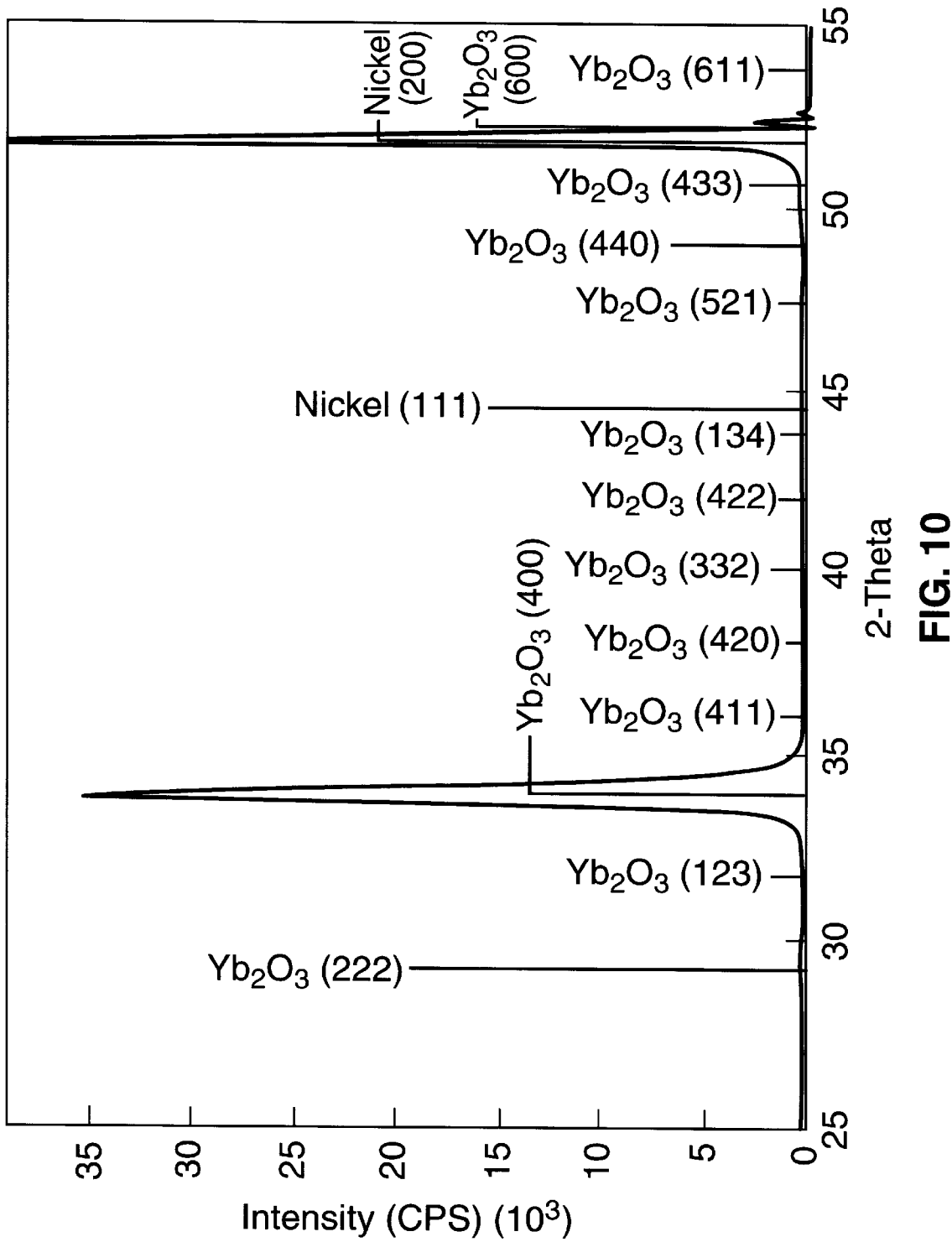
FIG. 10 is the room temperature powder X-ray diffraction pattern for a 400 nm thick $Yb_2O_3$-film grown on $Y_2O_3$-buffered Ni substrates by rf magnetron sputtering.
Figure 11:
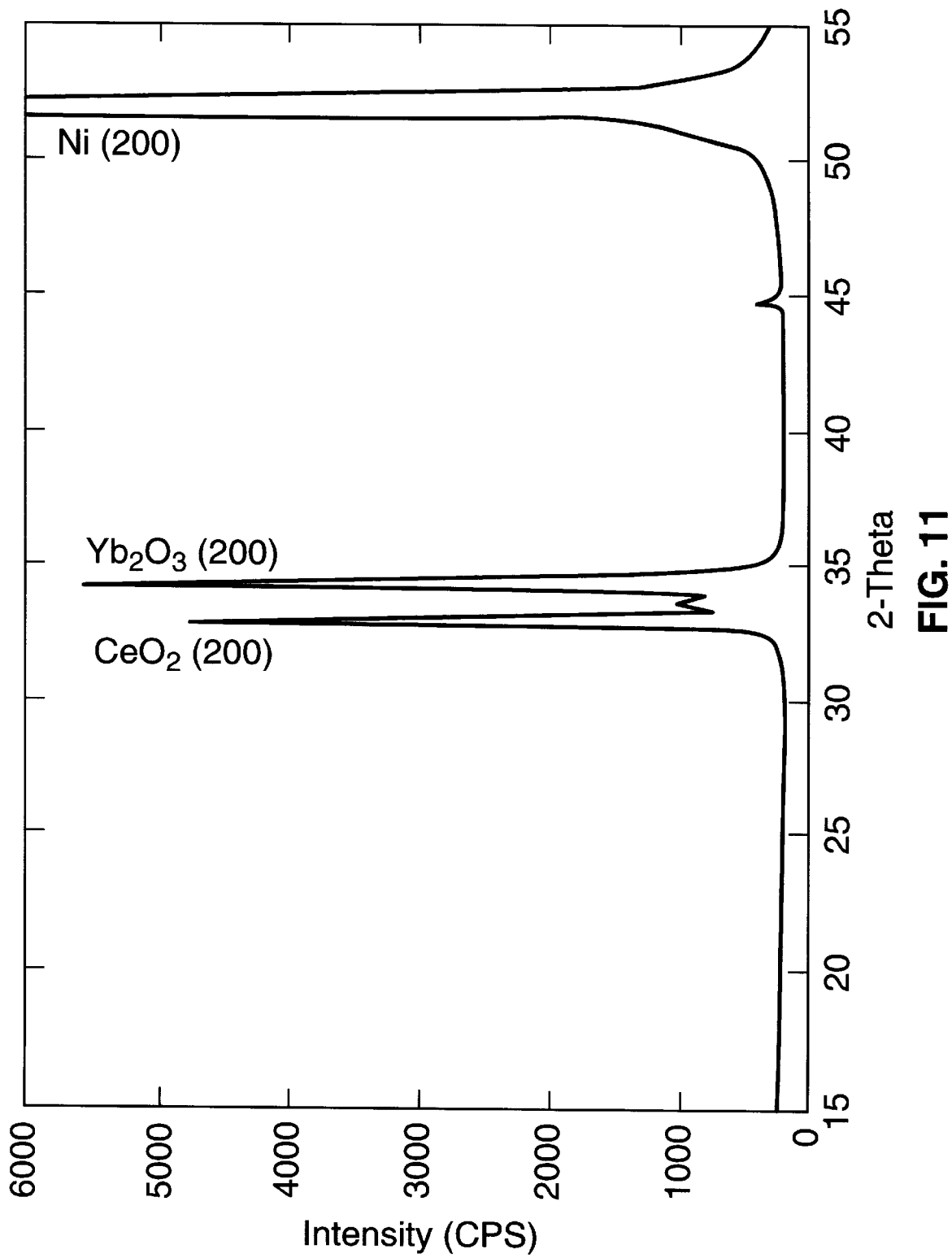
FIG. 11 is the room temperature powder X-ray diffraction pattern for $Yb_2O_3$-films grown on $CeO_2$-buffered Ni substrates by rf magnetron sputtering.

Growth of $Yb_2O_3$ on $Y_2O_3$-buffered or $CeO_2$-buffered Ni and/or Cu by rf Magnetron Sputtering Initially, $Y_2O_3$ or $CeO_2$ films were grown epitaxially by e-beam evaporation on Rolled-Ni substrates as described in Example 1. The $Yb_2O_3$ films were grown on these $Y_2O_3$-buffered or $CeO_2$-buffered Ni substrates by rf magnetron sputtering. The buffered substrate was mounted on a heating block inside the sputter chamber. Prior to heating the substrate, the sputter chamber was evacuated to a pressure of about $1\times10^{-6}$ Torr. The chamber was then back-filled with a flowing mixture of 4% $H_2$ and 96% Ar to a pressure of $5\times^{-2}$ Torr. The substrate was heated to 780° C. for 15 min, and then the pressure was reduced to $1\times10^{-2}$ Torr, and sputter deposited at about 780° C. for 60 min with an on-axis $Yb_2O_3$ target located 6 cm from the substrate. The plasma power was 75 W at 13.56 MHz. The resulting $Yb_2O_3$ film was smooth, and its thickness was estimated to be approximately 400 nm. FIG. 10 shows the η–2θ X-ray scan for a 400 nm thick $Yb_2O_3$ on $Y_2O_3$-buffered Ni substrates. The accompanying θ–2θ X-ray scan for a 400 nm thick $Yb_2O_3$ on $CeO_2$-buffered Ni substrates (as shown in FIG. 11) shows good out-of-plane texture for the $Yb_2O_3$ which is again consistent with epitaxy. From the (ω and φ scans for the $Yb_2O_3/CeO_2$/Ni film the FWHM for Ni (002), $CeO_2$ (002), and $Yb_2O_3$ (002) are 12.2°, 8.2°, and 10.7°, and that of Ni (111), $CeO_2$ (111), and $Yb_2O_3$ (222) are 10.3°, 8.7° and 8.7°, respectively. From the XRD results, it can be concluded that $Yb_2O_3$ can be grown epitaxially on $Y_2O_3$-buffered Ni and $CeO_2$-buffered Ni substrates. The $Yb_2O_3$ films were also grown epitaxially on YSZ/$CeO_2$/Ni.

Figure 12:
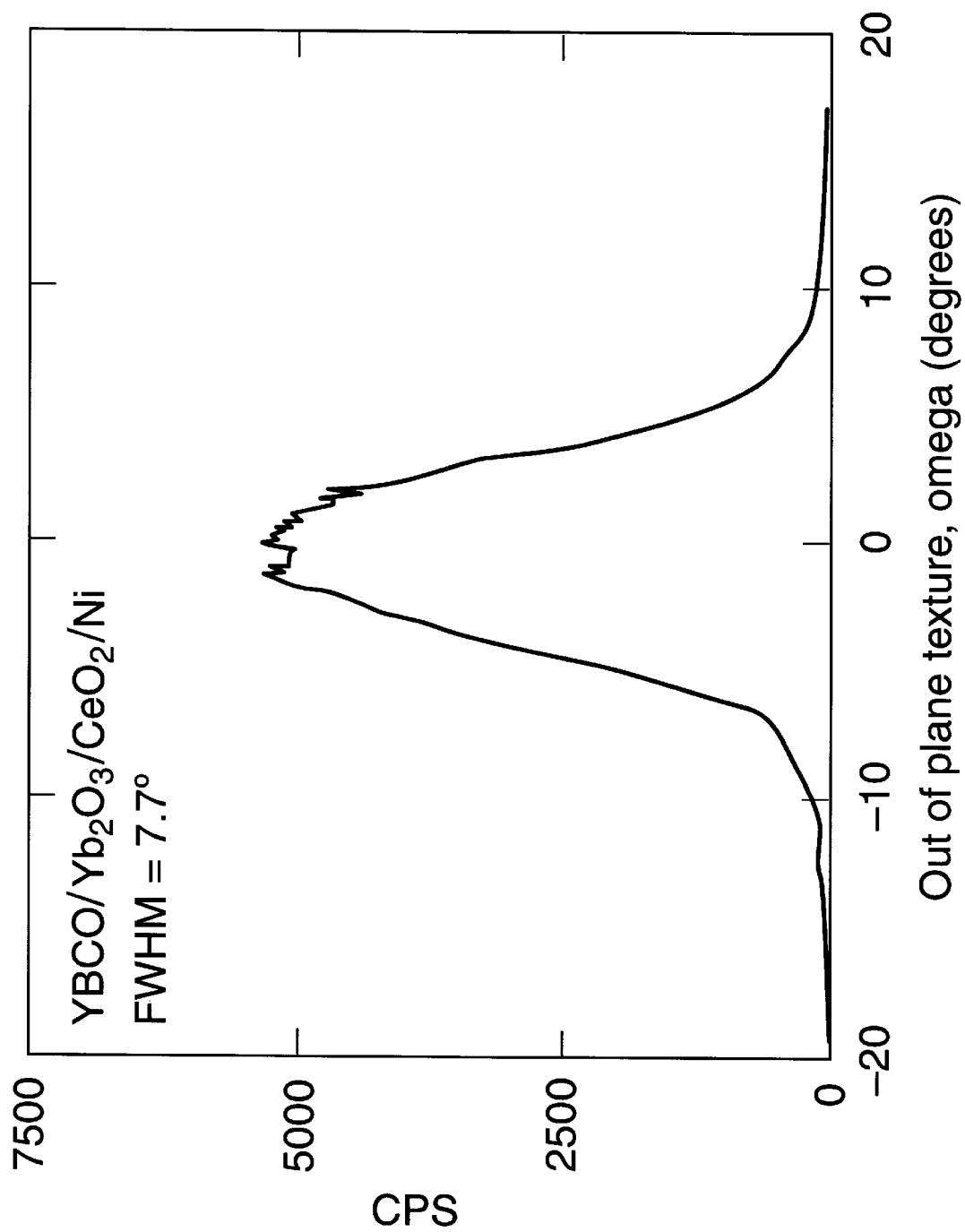
FIG. 12 is an X-ray ω scan for YBCO film on $Yb_2O_3$/$CeO_2$-buffered Ni substrates with FWHM of 7.7° for YBCO (006).
Figure 13:
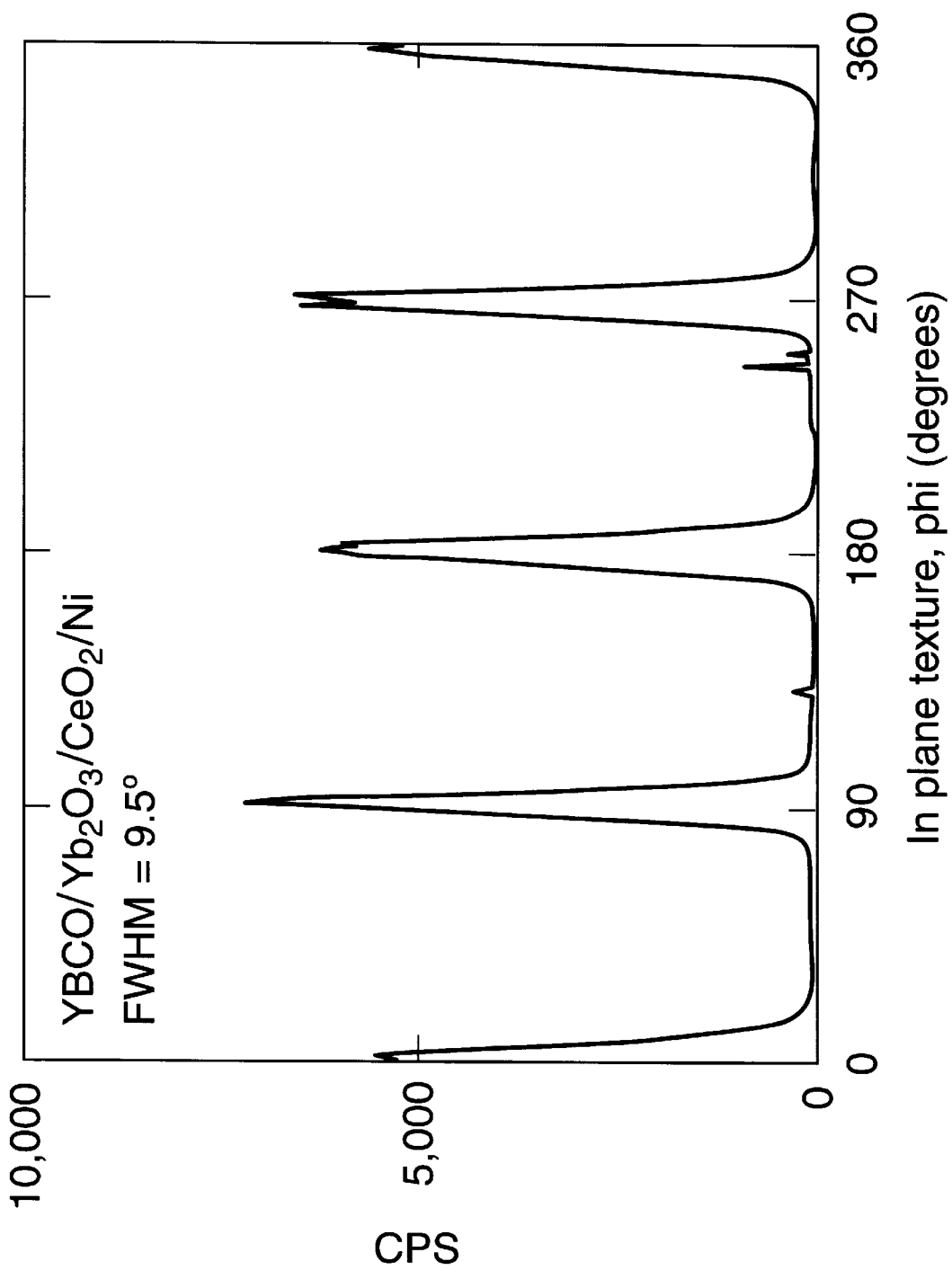
FIG. 13 is an X-ray φ scan for YBCO film on $Yb_2O_3$/$CeO_2$-buffered Ni substrates with FWHM of 9.5° for YBCO (103).
Figure 14:
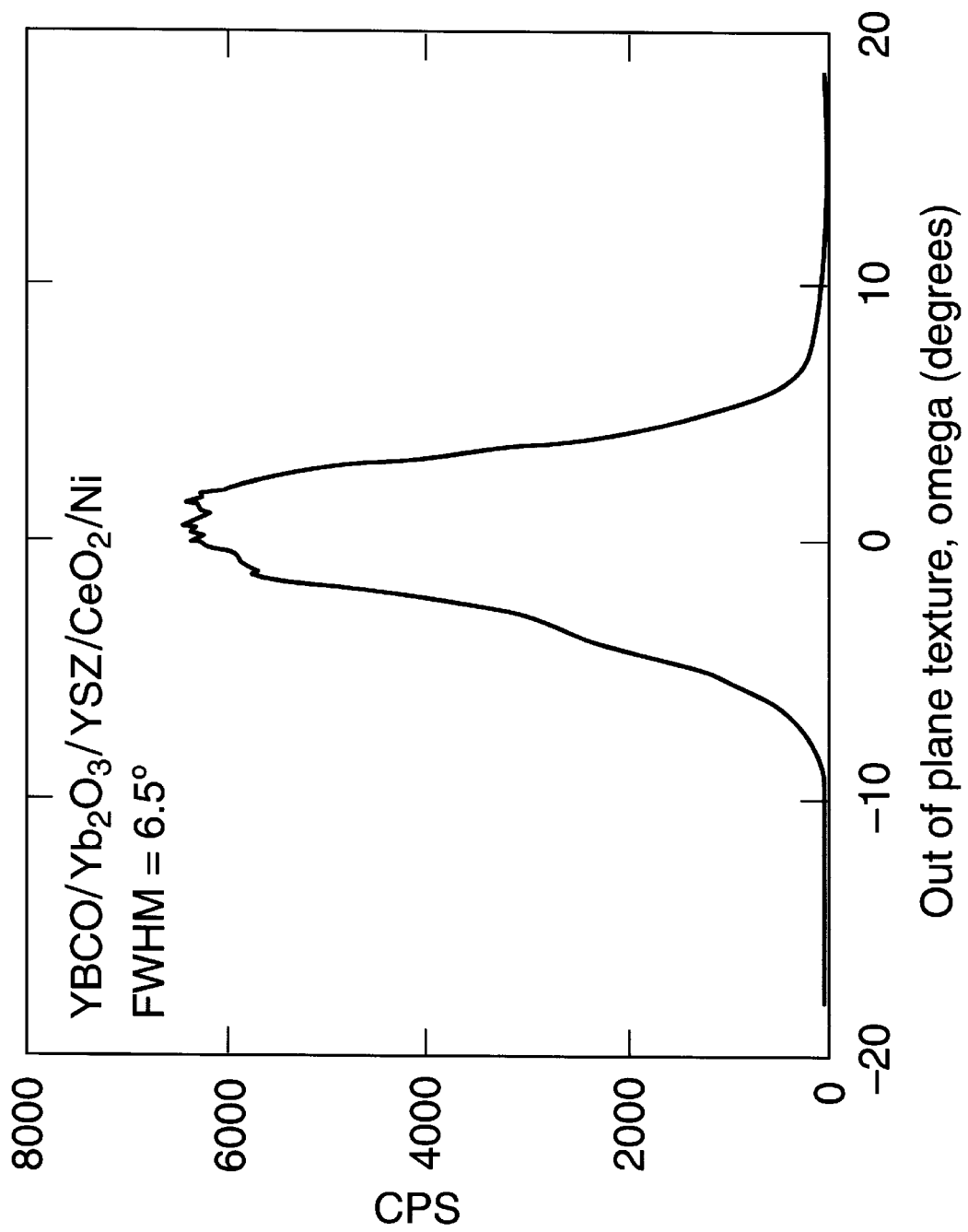
FIG. 14 is an X-ray ω scan for YBCO film on $Yb_2O_3$/YSZ/$CeO_2$-buffered Ni substrates with FWHM of 6.5° for YBCO (006).
Figure 15:
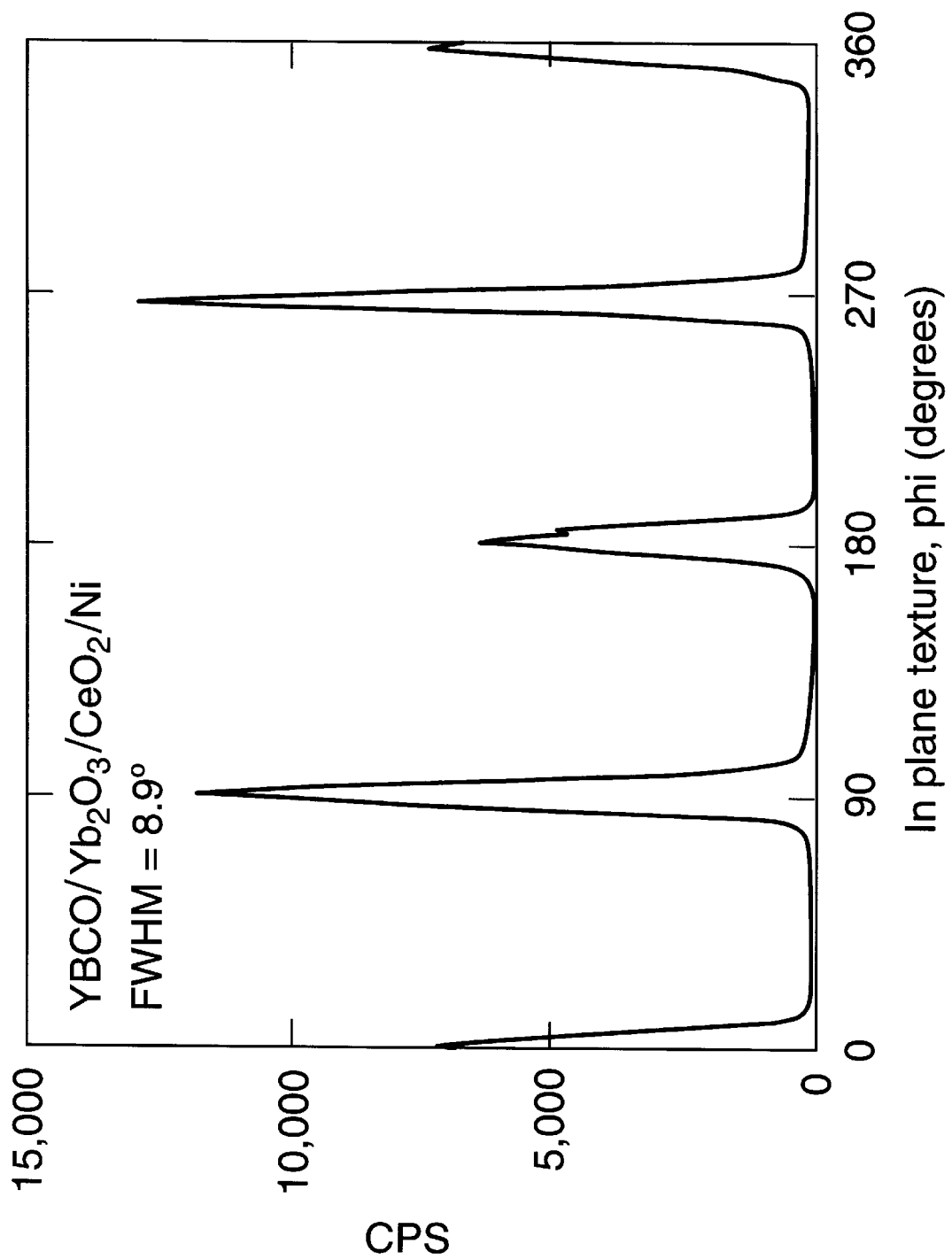
FIG. 15 is an X-ray φ scan for YBCO film on $Yb_2O_3$YSZ/$CeO_2$-buffered Ni substrates with FWHM of 8.9° for YBCO (103).
Figure 16:
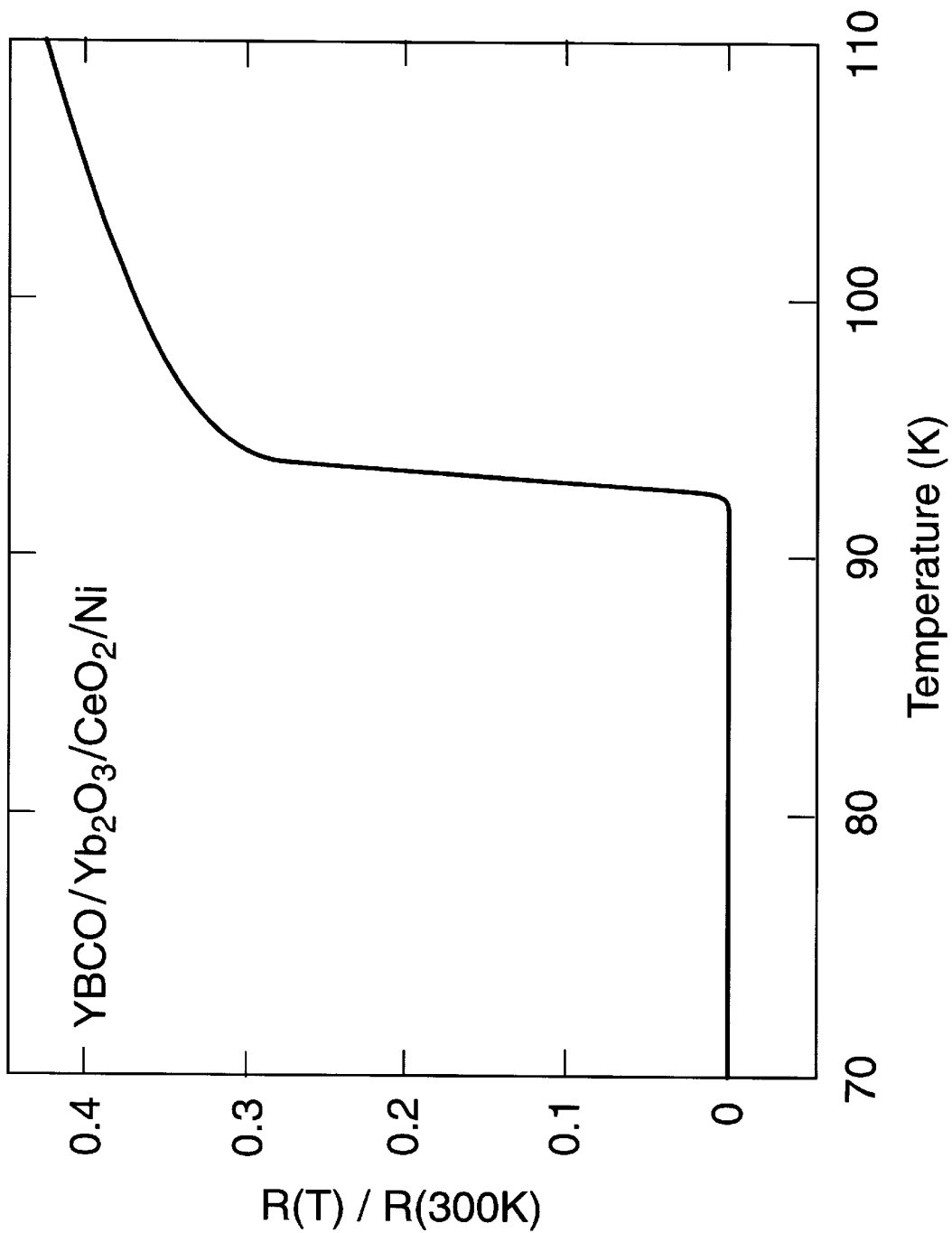
FIG. 16 is the temperature dependence resistivity plot for YBCO film on $Yb_2O_3$/$CeO_2$/Ni.
Figure 17:
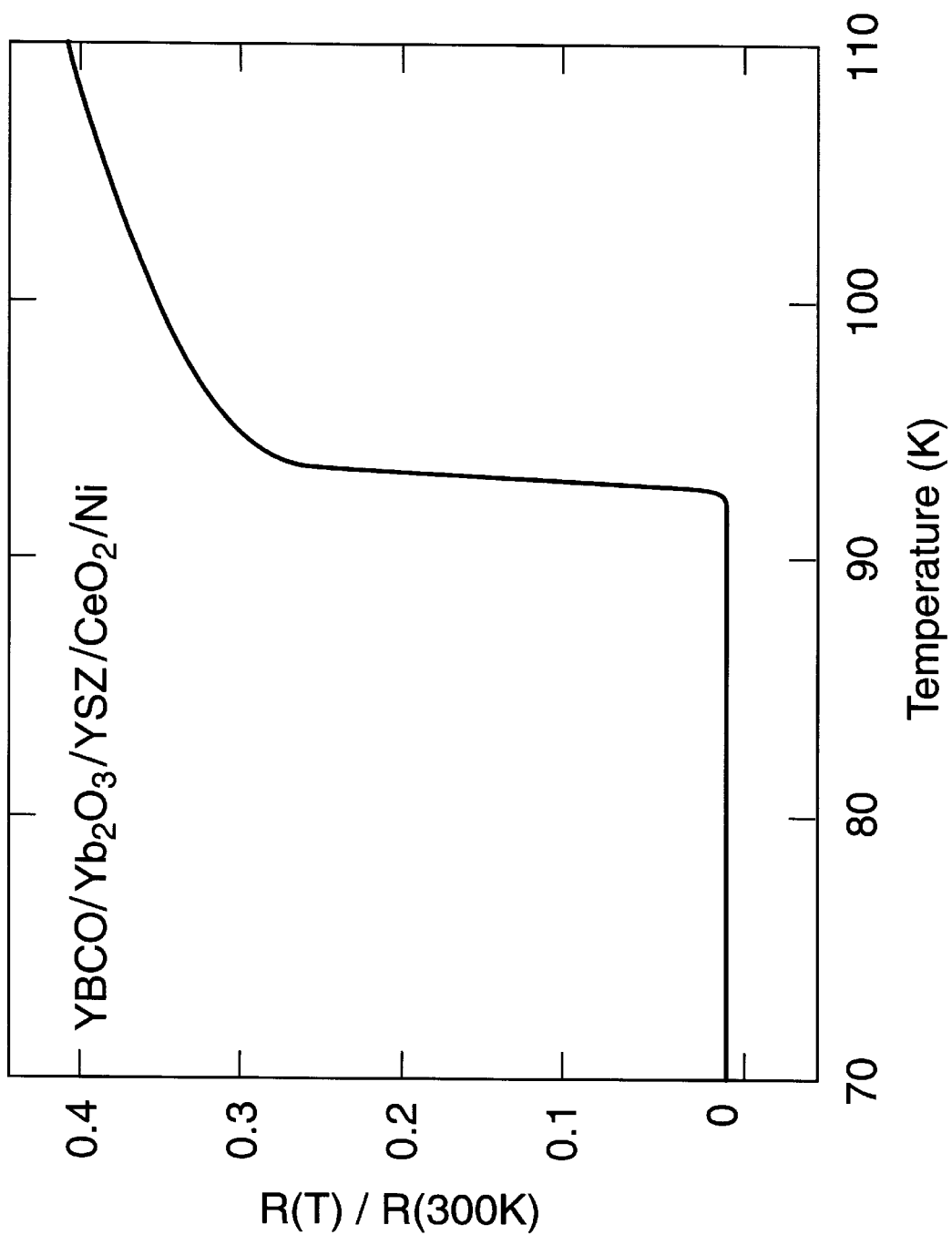
FIG. 17 is the temperature dependence resistivity plot for YBCO film on $Yb_2O_3$/YSZ/$CeO_2$/Ni.
Figure 18:
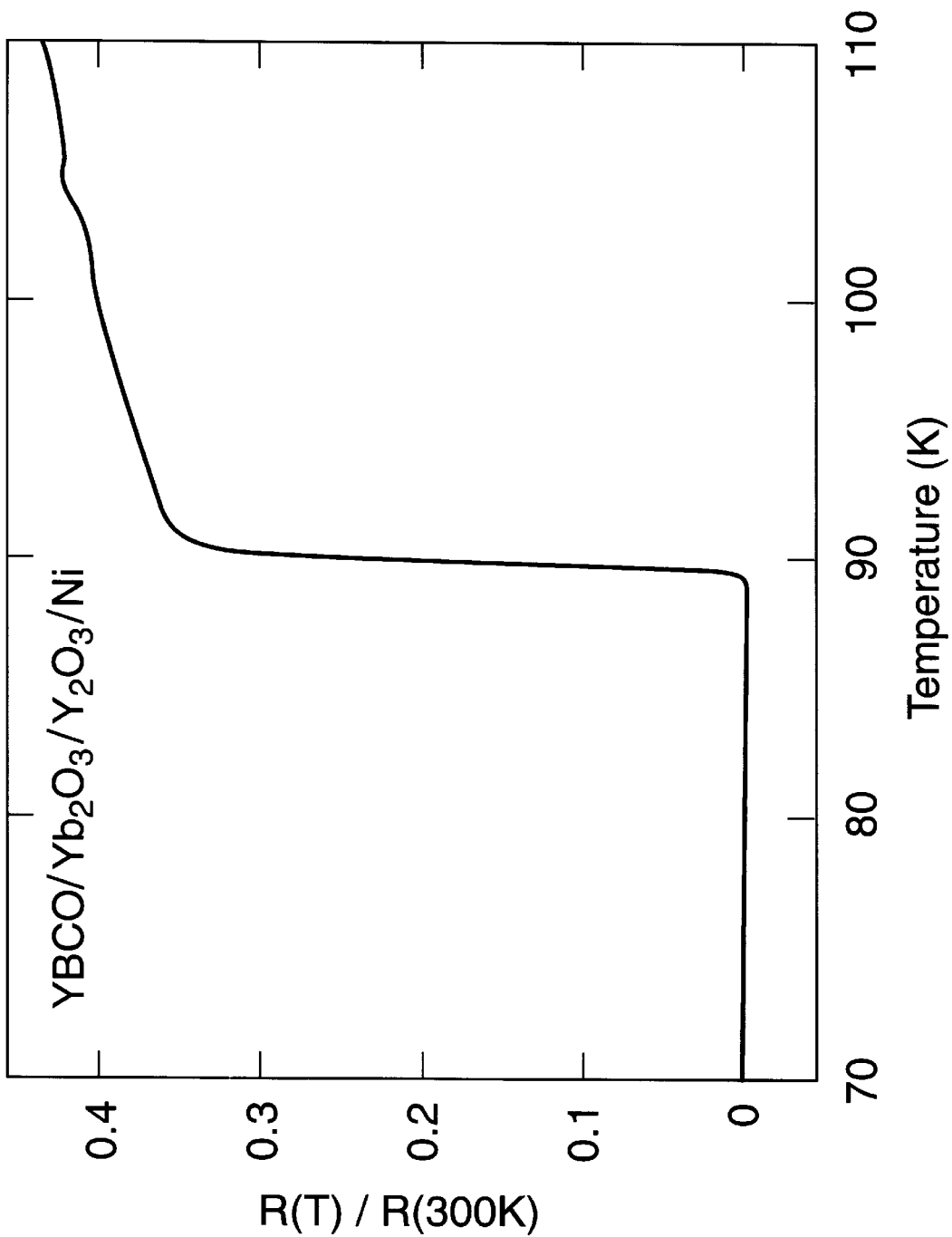
FIG. 18 is the temperature dependence resistivity plot for YBCO film on $Yb_2O_3$/$Y_2O_3$/Ni.
Figure 19:
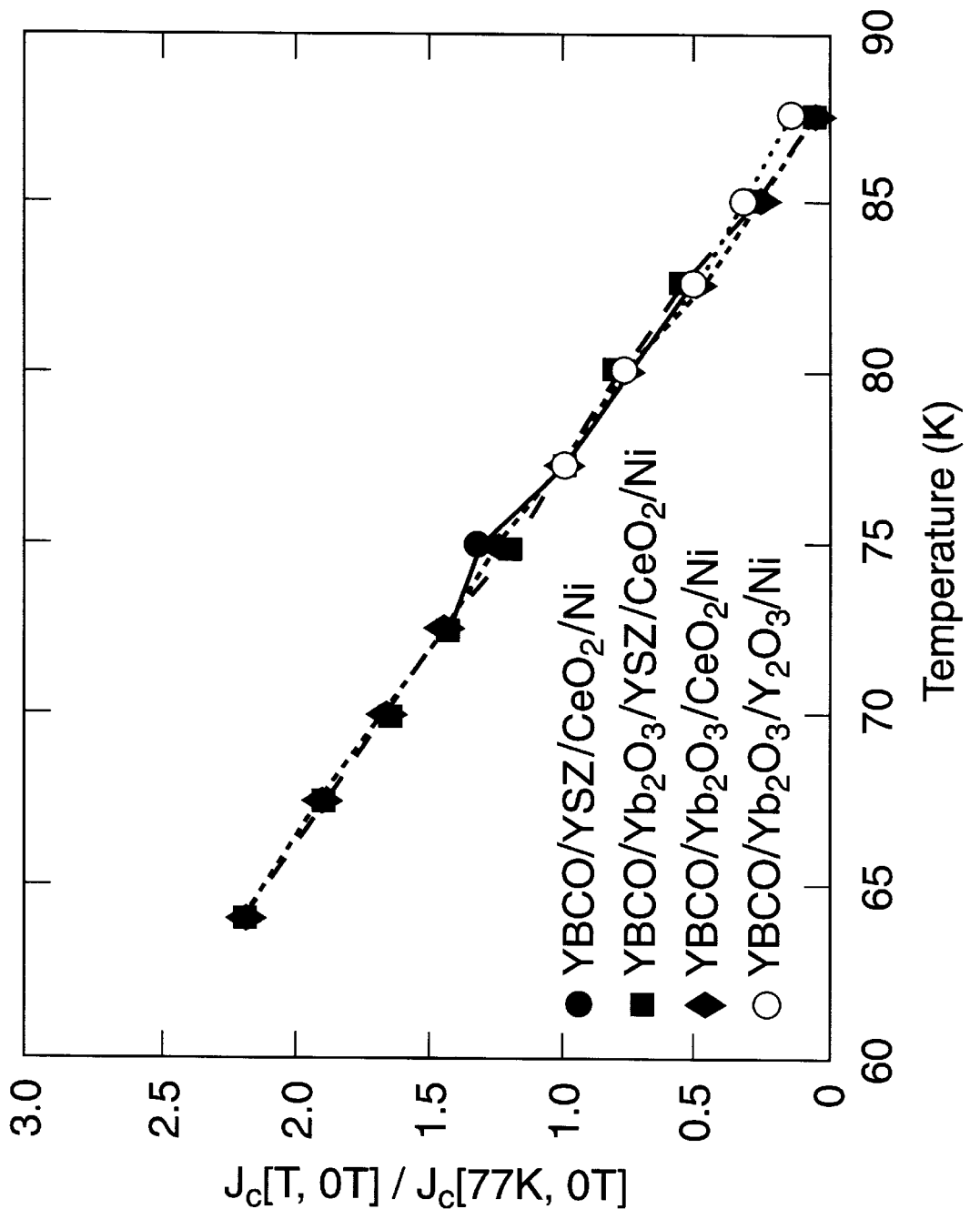
FIG. 19 shows the temperature dependence of normalized critical current densities of YBCO deposited on $Yb_2O_3$/YSZ/$CeO_2$/Ni, $Yb_2O_3$/$CeO_2$/Ni, and $Yb_2O_3$/$Y_2O_3$/Ni. Also included is the result of YBCO deposited on standard YSZ/$CeO_2$/Ni architecture for comparison.
Figure 20:
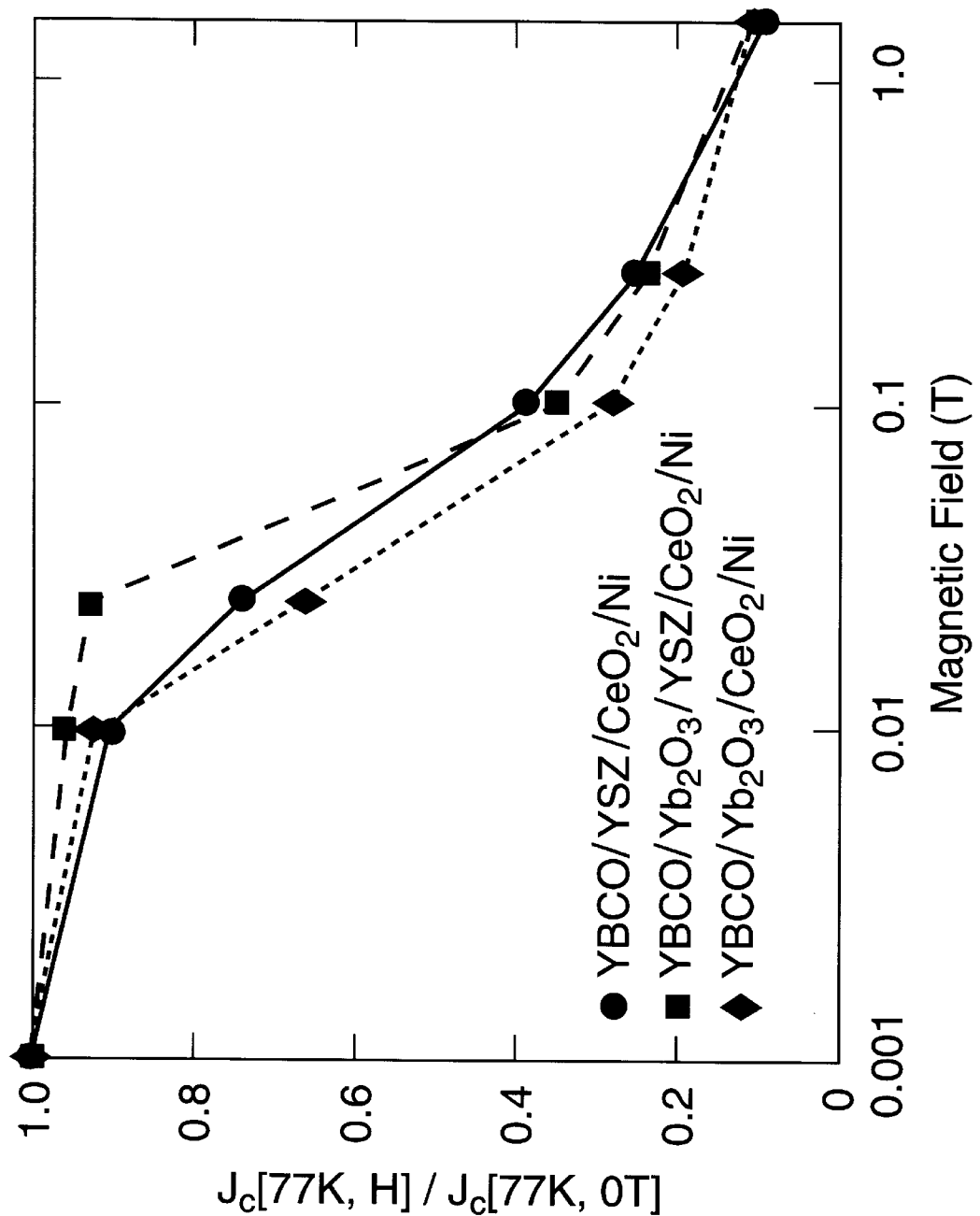
FIG. 20 shows the magnetic field dependence of normalized critical current densities of YBCO deposited on $Yb_2O_3$/YSZ/$CeO_2$/Ni and $Yb_2O_3$/$CeO_2$/Ni. Also included is the result of YBCO deposited on standard YSZ/$CeO_2$/Ni architecture for comparison.

YBCO was then grown by pulsed laser deposition on three epitaxial laminates of $Yb_2O_3/CeO_2$/Ni, $Yb_2O_3$/YSZ/$CeO_2$/Ni, and $Yb_2O_3/Y_2O_3$/Ni. The typical YBCO thickness was about 300 nm for $Yb_2O_3/CeO_2$/Ni and $Yb_2O_3$/YSZ/$CeO_2$/Ni, and about 400 nm for $Yb_2O_3/Y_2O_3$/Ni. From the XRD results, the YBCO films grown on all architectures were found to be epitaxial. The typical ω and φ scans for YBCO on $Yb_2O_3/CeO_2$-buffered Ni substrates with FWHM of 7.7° for YBCO (006) and 9.5° for YBCO (103) films are shown in FIGS. 12 and 13. The typical ω and φ scans for YBCO on $Yb_2O_3$/YSZ/$CeO_2$-buffered Ni substrates with FWHM of 6.5° for YBCO (006) and 8.9° for YBCO (103) films are shown in FIGS. 14 and 15. The X-ray data (FIGS. 12–15) demonstrate the presence of a single texture component of YBCO on $Yb_2O_3$ layers as compared to that of two texture components of YBCO grown directly on YSZ surface. The four probe resistivity plots showed a $T_c$ (zero resistance) of 90–92K for all three films (FIGS. 16, 17 and 18). The transport critical current-density $J_c$ was estimated to be $0.7\times10^6$ A/$cm^2$ for YBCO/$Yb_2O_3/CeO_2$/Ni and $1.4\times10^6$ A/$cm^2$ for YBCO/$Yb_2O_3$/YSZ/$CeO_2$/Ni, and 0.8 A/$cm^2$ for YBCO/$Yb_2O_3/Y_2O_3$/Ni at 77° K and zero field. The temperature and magnetic field dependence of normalized $J_c$ of these superconductors are shown in FIGS. 19 and 20. Also included are the data on films with YBCO deposited on standard YSZ/$CeO_2$/Ni architecture for comparison. As can be seen from these figures that the performance of YBCO deposited on alternative buffer architectures as disclosed in the present invention is similar to that of the standard RABiTS architecture, and demonstrate the presence of epitaxy and resulting strongly linked nature of the alternate buffer layers.

The methods described in Example 4 can also be used to grow $Yb_2O_3$ on $Y_2O_3$-buffered or $CeO_2$-buffered Cu as well as on alloys of Cu and/or Ni and other metals and alloys which can be characterized by a surface having biaxial texture by rf magnetron sputtering.

EXAMPLE 5

Growth of $Gd_2O_3$ on Textured-Ni Substrates by Reactive Evaporation

Figure 21:
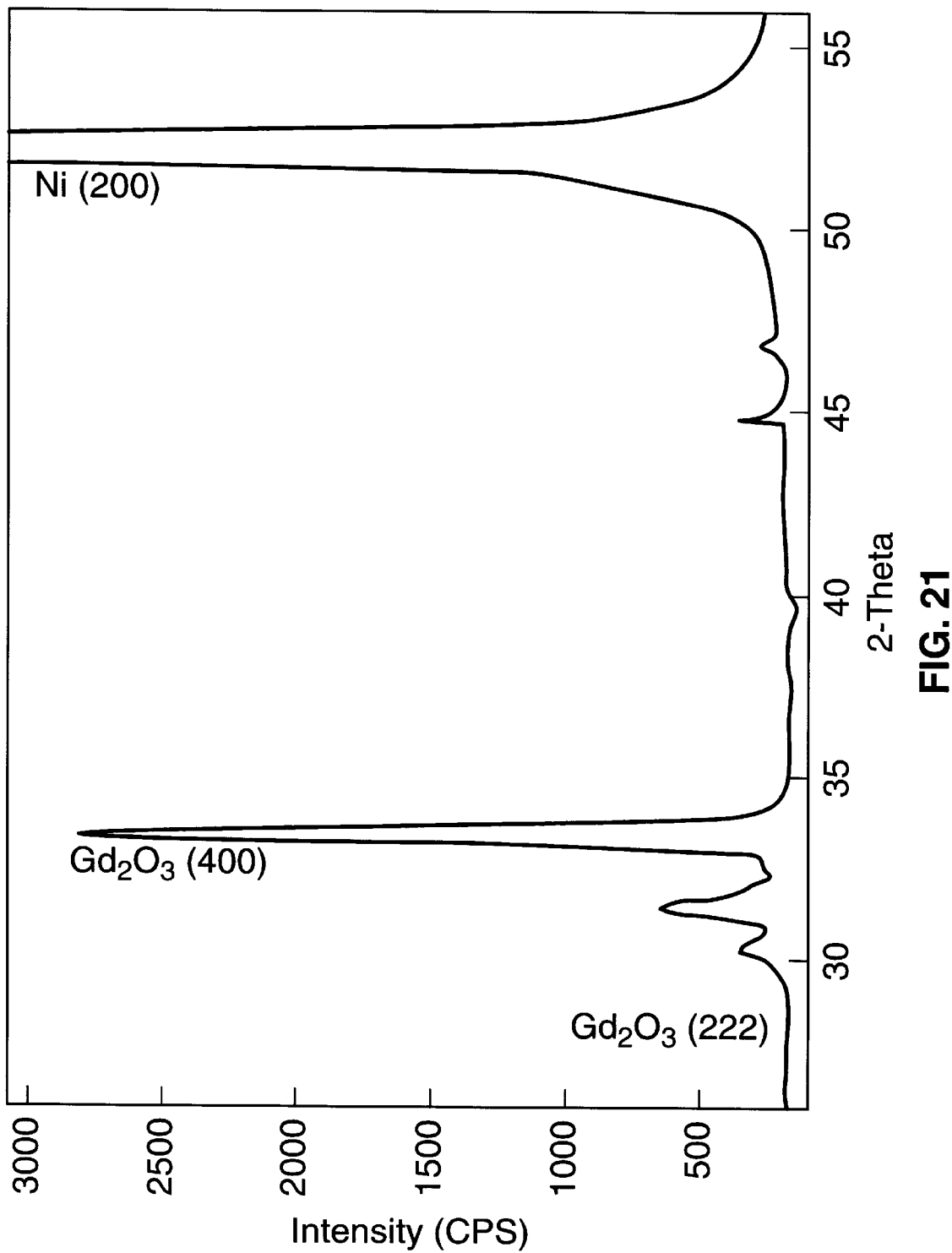
FIG. 21 shows the room temperature powder X-ray diffraction pattern for a 90-nm thick $Gd_2O_3$ film grown on textured-Ni substrates by e-beam evaporation.
Figure 22:
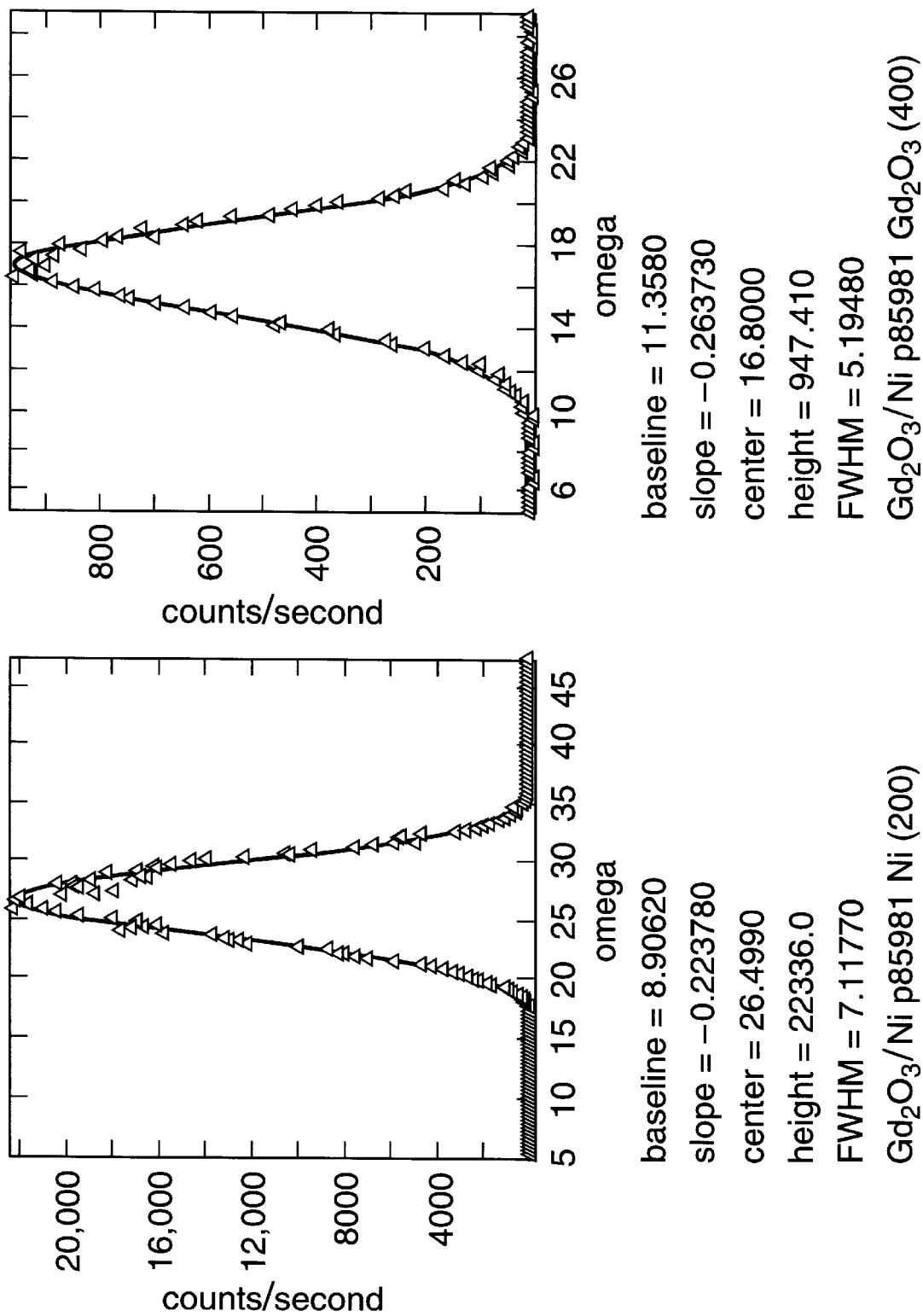
FIG. 22 is X-ray ω scans for a 90-nm thick $Gd_2O_3$-buffered Ni substrate with FWHM of 7.1° for Ni (200) and 5.2° for $Gd_2O_3$ (400).
Figure 23:
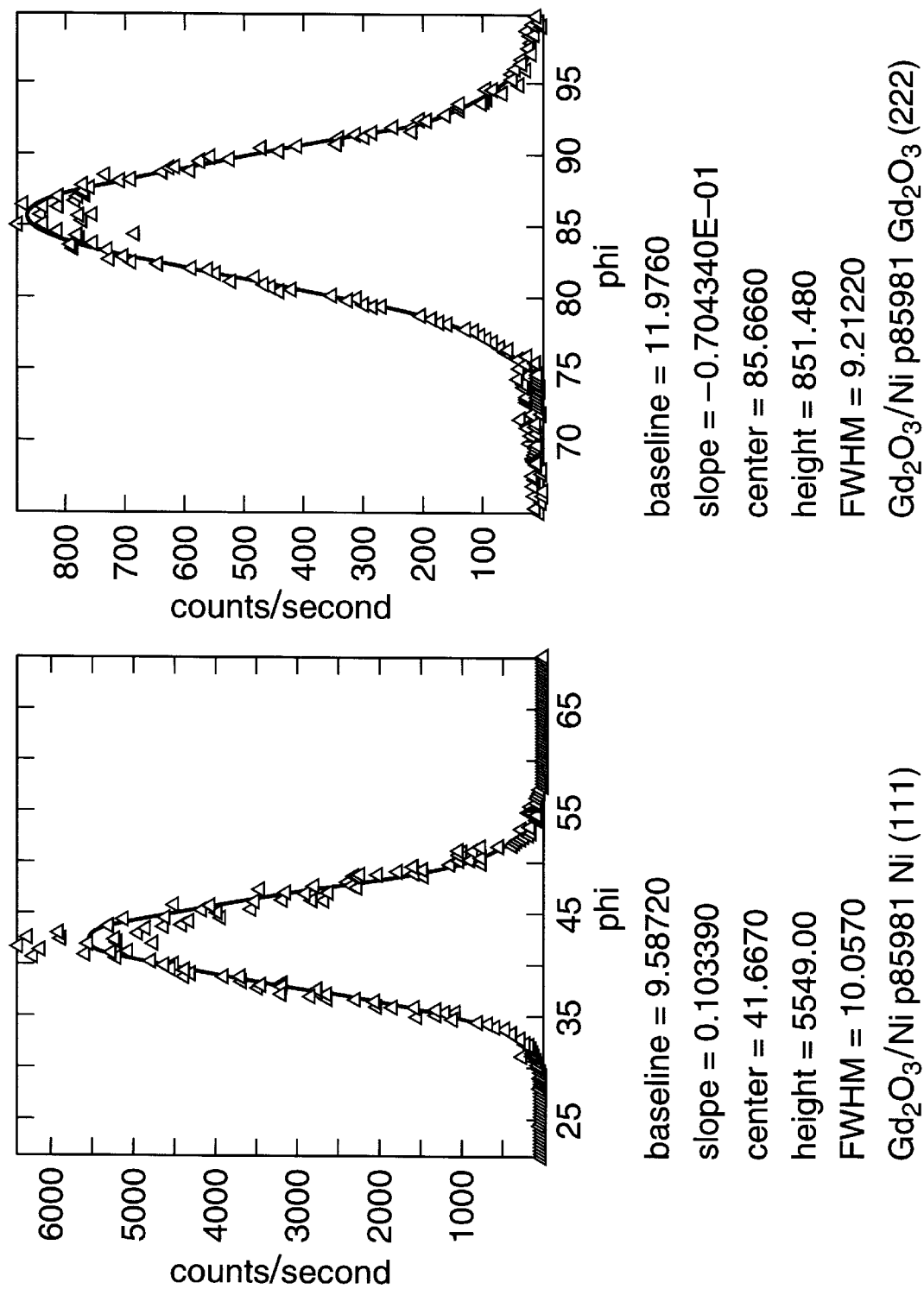
FIG. 23 is X-ray φ scans for a 90-nm thick $Gd_2O_3$-buffered Ni substrate with FWHM of 10.1° for Ni (111) and 9.2° for $Gd_2O_3$ (222).
Figure 24:
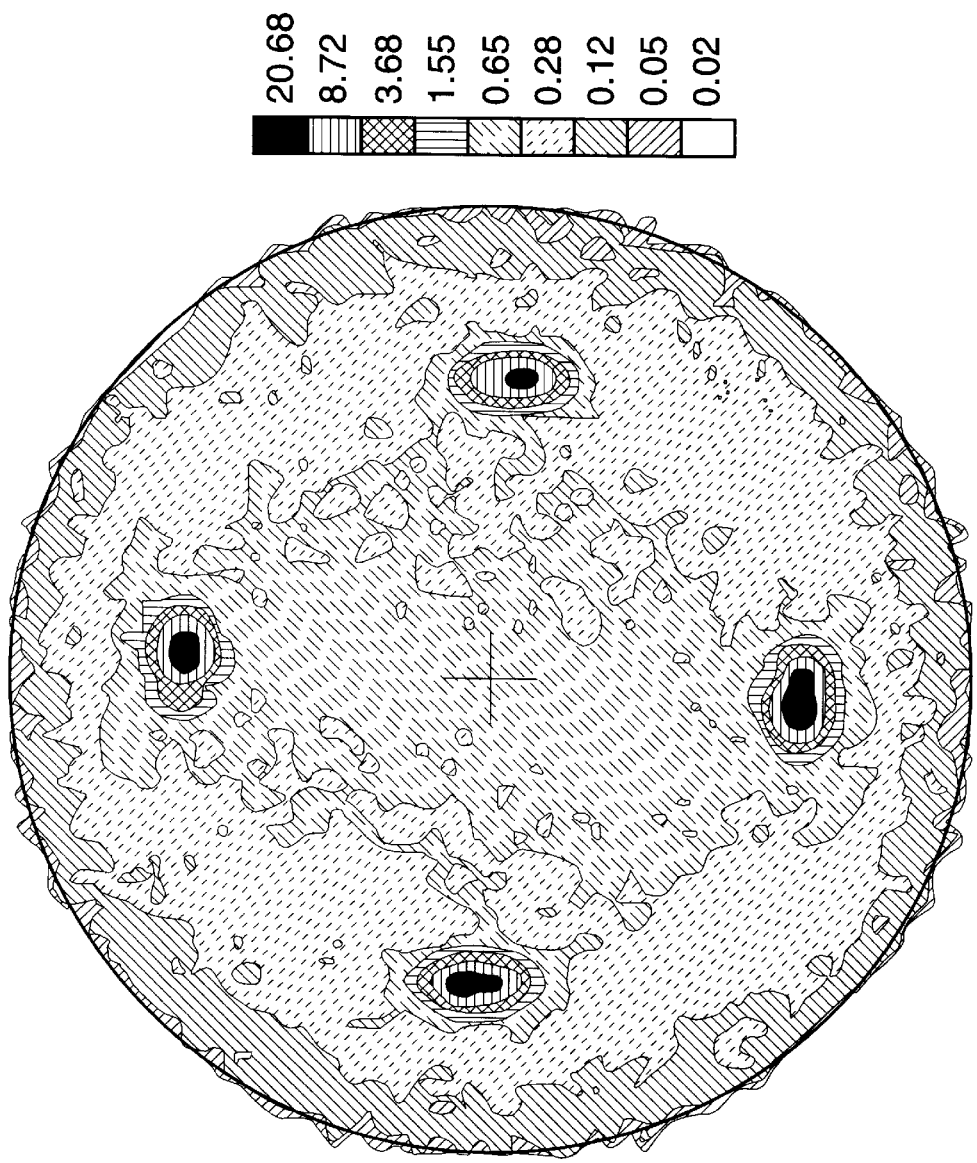
FIG. 24 is a pole figure for $Gd_2O_3$ film grown directly on textured-Ni (222) substrate by e-beam evaporation.

An electron beam (e-beam) evaporation technique was used to deposit $Gd_2O_3$ films directly on Ni. The as-rolled Ni substrates were cleaned ultrasonically with both acetone and methanol and recrystallized to the desired (100) cube texture by annealing the substrates at 800° C. for 2 hours in a vacuum of $10^{-6}$ Torr. Biaxially oriented Ni substrates were mounted on a substrate holder with a heater assembly in the e-beam system. After the vacuum in the chamber had reached $1\times10^{-6}$ Torr at room temperature a gas mixture of 4% $H_2$ and 96% Ar was introduced until the pressure inside the chamber reached 1 Torr. The Ni substrates were annealed at 700° C. for 1 hour at that pressure. The chamber was then pumped and maintained at a pressure of $2\times10^{-5}$ Torr using a mixture of 4% $H_2$ and 96% Ar. The gas flow was controlled by a dc-powered piezoelectric valve. To understand the chemistry of the oxide formation, a Dycor Quadruple Gas Analyzer was mounted in the e-beam system. The background $H_2O$ pressure (p$H_2O$) in the system was around $1\times10^{-5}$ Torr. The crucibles used were usually graphite. Gadolinium metal was used as the source. The $Gd_2O_3$ layers were grown on the Ni substrates at temperatures ranging from 200 to 800° C. The deposition rate for $Gd_2O_3$ was 1–5 Å/sec with the operating pressure of $10^{-5}$ Torr, and the final thickness was varied from 10 to 500 nm. During the deposition, the $H_2O$ pressure slowly fell to $4\times10^{-6}$ Torr (when Quartz Crystal Monitor was reading about 10 nm). The $H_2O$ was introduced into the system through a valve to maintain the $H_2O$ pressure around $1\times10^{-5}$ Torr throughout the deposition. This $H_2O$ pressure was sufficient to oxidize the film to form $Gd_2O_3$ preferentially without oxidizing the Ni underneath. Also, just before the deposition, the Gd metal was evaporated for a few seconds with the shutter closed. This was critical in changing the partial pressure of from $10^{-7}$ Torr to $10^{-8}$ Torr. The Gd metal acts as an oxygen getter. The XRD results from the θ–2θ scan (as shown in FIG. 21), ω and φ scans for as-deposited $Gd_2O_3$ (90 nm thick) on Ni at 700° C. is as follows: The strong $Gd_2O_3$ (400) from FIG. 21 revealed the presence of a good out-of-plane texture. The FWHM for Ni (200) and $Gd_2O_3$ (400) are 7.1° and 5.2° (FIG. 22), and that of Ni (111) and $Gd_2O_3$ (222) are 10.1° and 9.2° (FIG. 23), respectively. The $Gd_2O_3$ (222) pole figure for $Gd_2O_3$ films grown at 700° C. on Ni is shown in FIG. 24. From the XRD results, it can be concluded that $Gd_2O_3$ can be grown epitaxially on Ni, Cu, and alloys thereof.

TABLE 1

| $RE_2O_3$ type | Structure type | a (Å) | a/2√2 or a/√2 | Melting point (RE) | Temp. @ vap. pressure $10^{-6}$ Torr | Temp. @ vap. pressure $10^{-4}$ Torr |
|---|---|---|---|---|---|---|
| | | | | data for pure metals (° C.) | | |
| $Y_2O_3$ | cubic | 10.604 | 3.750 | 1509 | 973 | 1157 |
| $La_2O_3$ | cubic | 11.327 | 4.005 | 920 | 1212 | 1388 |
| $CeO_2$ | cubic | 5.411 | 3.827 | 795 | 1150 | 1380 |
| $PrO_{1.83}$ | cubic | 5.47 | 3.868 | 931 | 950 | 1150 |
| $Nd_2O_3$ | cubic | 11.08 | 3.918 | 1024 | 871 | 1062 |
| $Sm_2O_3$ | cubic | 10.927 | 3.864 | 1072 | 460 | 573 |
| $Eu_2O_3$ | cubic | 10.868 | 3.843 | 822 | 360 | 480 |
| $Gd_2O_3$ | cubic | 10.813 | 3.824 | 1312 | 900 | 1175 |
| $Tb_2O_3$ | cubic | 10.730 | 3.794 | 1357 | 950 | 1150 |
| $Dy_2O_3$ | cubic | 10.665 | 3.771 | 1409 | 750 | 900 |
| $Ho_2O_3$ | cubic | 10.606 | 3.750 | 1470 | 770 | 950 |
| $Er_2O_3$ | cubic | 10.548 | 3.730 | 1497 | 775 | 930 |
| $Tm_2O_3$ | cubic | 10.487 | 3.708 | 1545 | 554 | 680 |
| $Yb_2O_3$ | cubic | 10.436 | 3.690 | 824 | 590 | 690 |
| $Lu_2O_3$ | cubic | 10.390 | 3.674 | 1652 | | 1300 |
| $(Y_{0.95}Eu_{0.05})_2O_3$ | cubic | 10.604 | 3.750 | | | |
| $Y_2Ce_2O_7$ | cubic | 5.370 | 3.798 | | | |
| $(Gd_{0.6}Ce_{0.4})_2O_{3.2}$ | cubic | 10.858 | 3.839 | | | |
| $(Gd_{0.3}Ce_{0.7})O_{1.85}$ | cubic | 5.431 | 3.841 | | | |

The present invention clearly demonstrates the epitaxial growth of of $Y_2O_3$ and $RE_2O_3$ layers on rolled-Ni and/or Cu substrates with or without additional buffer layers. The present invention also demonstrates new single and multi-buffer layer architectures for high current YBCO conductors.

Further, processing conditions such as those described hereinabove may be used to grow other buffer layers such as $REAlO_3$ (RE=Rare Earth), $AEZrO_3$ (AE=Ca,Sr,Ba), $RE_2Zr_2O_7$ (RE=Rare Earth), Ca-stabilized Zirconia, Ti, Nb or Zr doped $CeO_2$, and $AECeO_3$ (AE=Ca,Sr,Ba) on rolled substrates. Other metallic substrates may also be used for growing these buffer layers.

Various techniques which can be used to deposit these buffer layers include but are not limited to: physical vapor deposition techniques which include electron-beam evaporation, rf magnetron sputtering, pulsed laser deposition, thermal evaporation, and solution precursor approaches, which include chemical vapor deposition, combustion CVD, metal-organic decomposition, sol-gel processing, and plasma spray.

While the preferred embodiments of the invention have been shown and disclosed, it will be obvious to those skilled in the art that various changes and modifications can be made therein without departing from the scope of the invention defined by the appended claims.

We claim:

1. A method for making a biaxially textured article comprising the steps of:
   (A) providing a substrate comprising at least one metal, the substrate having a surface exhibiting biaxial texture; and
   (B) epitaxially depositing upon the biaxially textured surface of the substrate a buffer layer selected from the group consisting of $Y_2O_3$ and $RE_2O_3$.

2. The method for making a biaxially textured article as described in claim 1 wherein the buffer layer is a first buffer layer comprising $Y_2O_3$; the method further comprising the additional step of:
   (C) epitaxially depositing upon the biaxially textured surface of the $Y_2O_3$ a second buffer layer selected from the group consisting of $RE_2O_3$ and YSZ.

3. A method for making a biaxially textured article comprising the steps of:
   (A) providing a substrate comprising at least one metal, the substrate having a surface exhibiting biaxial texture;
   (B) epitaxially depositing upon the biaxially textured surface of the substrate a first buffer layer comprising $CeO_2$;
   (C) epitaxially depositing upon the biaxially textured surface of the $CeO_2$ a second buffer layer selected from the group consisting of $Y_2O_3$ and $RE_2O_3$.

4. A method for making a biaxially textured article comprising the steps of:
   (A) providing a substrate comprising at least one metal, the substrate having a surface exhibiting biaxial texture;
   (B) epitaxially depositing upon the biaxially textured surface of the substrate a first buffer layer comprising $CeO_2$;
   (C) epitaxially depositing upon the biaxially textured surface of the $CeO_2$ a second buffer layer comprising YSZ, and
   (D) epitaxially depositing upon the biaxially textured surface of the YSZ a third buffer layer selected from the group consisting of $Y_2O_3$ and $RE_2O_3$.

5. A method for making a biaxially textured article comprising the steps of:
   (A) providing a substrate comprising at least one metal, the substrate having a surface exhibiting biaxial texture; and
   (B) epitaxially depositing upon the biaxially textured surface of the substrate a buffer layer comprising $(RE')_xO_y$, wherein x is about 2.0, and y is between about 3.0 and about 3.7.

* * * * *